US012689842B2

(12) United States Patent
Morimoto et al.

(10) Patent No.: US 12,689,842 B2
(45) Date of Patent: Jul. 21, 2026

(54) PHOTOELECTRIC CONVERSION APPARATUS

(71) Applicant: CANON KABUSHIKI KAISHA, Tokyo (JP)

(72) Inventors: Kazuhiro Morimoto, Kanagawa (JP); Yu Maehashi, Hokkaido (JP)

(73) Assignee: Canon Kabushiki Kaisha, Tokyo (JP)

( * ) Notice: Subject to any disclaimer, the term of this patent is extended or adjusted under 35 U.S.C. 154(b) by 34 days.

(21) Appl. No.: 18/797,355

(22) Filed: Aug. 7, 2024

(65) Prior Publication Data

US 2024/0397229 A1 Nov. 28, 2024

Related U.S. Application Data

(63) Continuation of application No. PCT/JP2023/002358, filed on Jan. 26, 2023.

(30) Foreign Application Priority Data

Feb. 8, 2022 (JP) ................................. 2022-018105

(51) Int. Cl.
| | |
|---|---|
| *H04N 25/77* | (2023.01) |
| *H04N 25/702* | (2023.01) |
| *H10F 39/00* | (2025.01) |

(52) U.S. Cl.
CPC ........... *H04N 25/77* (2023.01); *H04N 25/702* (2023.01); *H10F 39/809* (2025.01)

(58) Field of Classification Search
CPC .. H04N 25/77; H04N 25/702; H04N 25/7795; H04N 25/79; H04N 25/773; H10F 39/809
See application file for complete search history.

(56) References Cited

U.S. PATENT DOCUMENTS

| | | | |
|---|---|---|---|
| 11,297,269 | B2 | 4/2022 | Yasuda et al. |
| 11,601,608 | B2 | 3/2023 | Maekawa |
| 2018/0208112 | A1* | 7/2018 | Tayama ................... B60Q 5/00 |

(Continued)

FOREIGN PATENT DOCUMENTS

| | | |
|---|---|---|
| CN | 113885036 A | 1/2022 |
| JP | 2014059302 A | 4/2014 |

(Continued)

*Primary Examiner* — Mekonnen D Dagnew
(74) *Attorney, Agent, or Firm* — Canon U.S.A., Inc. IP Division

(57) ABSTRACT

A photoelectric conversion apparatus includes a first pixel and a second pixel. The first pixel includes a first photoelectric converter, a first detection circuit that outputs a first detection signal, a first output circuit that outputs a first pixel signal in accordance with the first detection signal, and a first control circuit that controls whether the first detection signal is input into the first output circuit. The second pixel includes a second photoelectric converter, a second detection circuit that outputs a second detection signal, a second output circuit that outputs a second pixel signal in accordance with the second detection signal, and a second control circuit that controls whether the second detection signal is input into the second output circuit. The first control circuit controls whether the first detection signal is input into the first output circuit in accordance with the second detection signal.

24 Claims, 26 Drawing Sheets

(56) References Cited

U.S. PATENT DOCUMENTS

| | | | |
|---|---|---|---|
| 2020/0252563 A1 | 8/2020 | Yasuda et al. | |
| 2021/0037203 A1 | 2/2021 | Maekawa | |
| 2021/0314535 A1* | 10/2021 | Kobayashi | G06V 10/26 |
| 2022/0075066 A1 | 3/2022 | Azuma | |
| 2022/0137192 A1 | 5/2022 | Yin | |
| 2022/0302192 A1* | 9/2022 | Yamakawa | H01L 21/3205 |
| 2022/0390576 A1* | 12/2022 | Buckbee | G01S 7/4863 |

FOREIGN PATENT DOCUMENTS

| | | | |
|---|---|---|---|
| JP | 2020120175 A | 8/2020 |
| JP | 2020127122 A | 8/2020 |
| JP | 2021022875 A | 2/2021 |
| WO | 2020235411 A1 | 11/2020 |

* cited by examiner

FIG. 5A
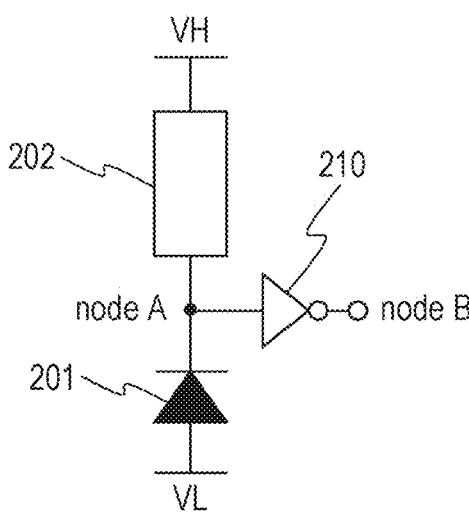
FIG. 5B
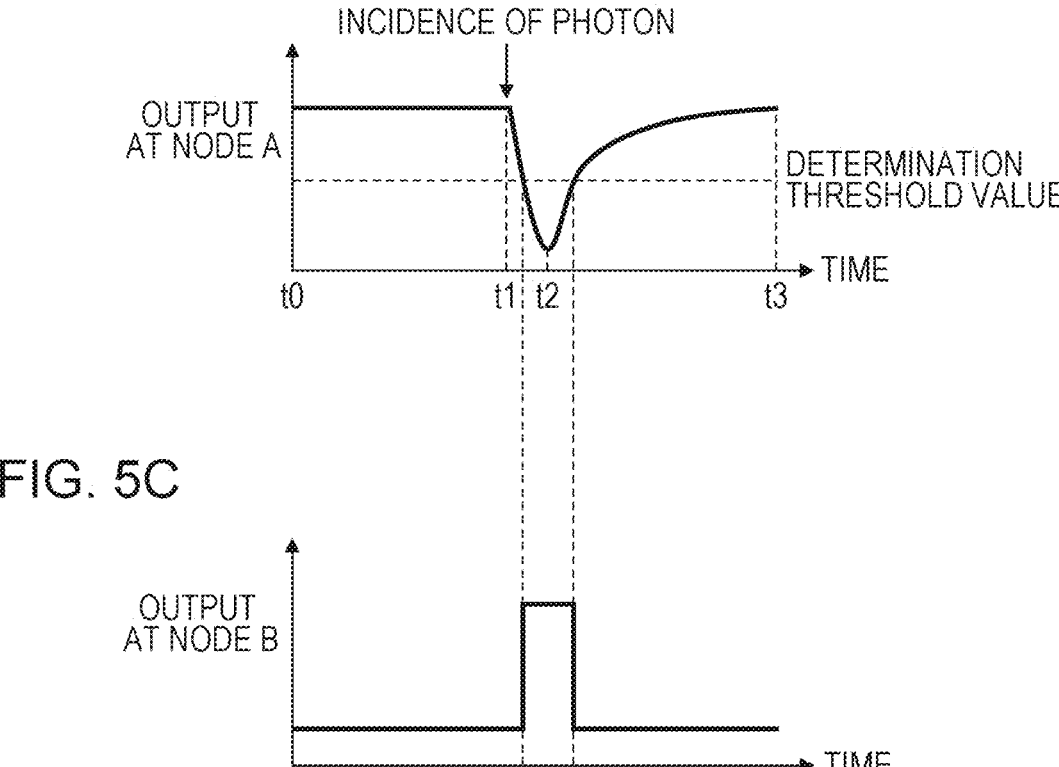
FIG. 5C

CENTER PIXEL IN
ONE-DIMENSIONAL ARRAY

END PIXEL OF
ONE-DIMENSIONAL ARRAY

: TARGET PIXEL

: PIXELS THAT CONTROL CONTROL CIRCUIT OF TARGET PIXEL

: PIXELS THAT DO NOT CONTROL CONTROL CIRCUIT OF TARGET PIXEL

FIG. 13

: TARGET PIXEL

: PIXELS THAT CONTROL CONTROL CIRCUIT OF TARGET PIXEL

: PIXELS THAT DO NOT CONTROL CONTROL CIRCUIT OF TARGET PIXEL

PATTERN 1

☒ : TARGET PIXEL

▨ : PIXELS THAT CONTROL
CONTROL CIRCUIT OF TARGET PIXEL

☐ : PIXELS THAT DO NOT CONTROL
CONTROL CIRCUIT OF TARGET PIXEL

PATTERN 2

☒ : TARGET PIXEL

▨ : PIXELS THAT CONTROL
CONTROL CIRCUIT OF TARGET PIXEL

☐ : PIXELS THAT DO NOT CONTROL
CONTROL CIRCUIT OF TARGET PIXEL

PATTERN 3

☒ : TARGET PIXEL

▨ : PIXELS THAT CONTROL CONTROL CIRCUIT OF TARGET PIXEL

☐ : PIXELS THAT DO NOT CONTROL CONTROL CIRCUIT OF TARGET PIXEL

PATTERN 4

☒ : TARGET PIXEL

▨ : PIXELS THAT CONTROL CONTROL CIRCUIT OF TARGET PIXEL

☐ : PIXELS THAT DO NOT CONTROL CONTROL CIRCUIT OF TARGET PIXEL

FIG. 19A

CENTER PIXEL IN TWO-DIMENSIONAL ARRAY

| A | A | A | A | A |
|---|---|---|---|---|
| B | B | B | B | B |
| A | A | A | A | A |
| B | B | B | B | B |
| A | A | A | A | A |

FIG. 19B

CORRELATION MAP OF PIXEL A

▨ : TARGET PIXEL

▧ : PIXELS THAT CONTROL CONTROL CIRCUIT OF TARGET PIXEL

☐ : PIXELS THAT DO NOT CONTROL CONTROL CIRCUIT OF TARGET PIXEL

FIG. 19C

CORRELATION MAP OF PIXEL B

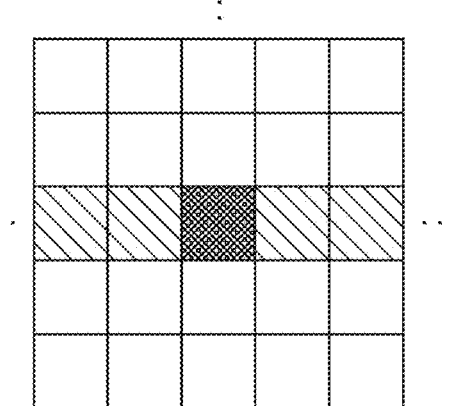

▨ : TARGET PIXEL

▧ : PIXELS THAT CONTROL CONTROL CIRCUIT OF TARGET PIXEL

☐ : PIXELS THAT DO NOT CONTROL CONTROL CIRCUIT OF TARGET PIXEL

FIG. 20A

CENTER PIXEL IN TWO-DIMENSIONAL ARRAY

| A | B | A | B | A |
|---|---|---|---|---|
| B | A | B | A | B |
| A | B | A | B | A |
| B | A | B | A | B |
| A | B | A | B | A |

FIG. 20B

CORRELATION MAP OF PIXEL A

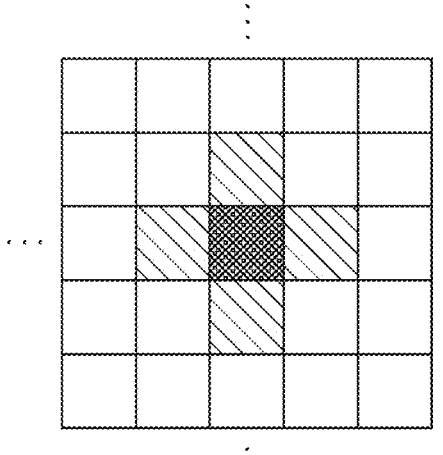

■ : TARGET PIXEL

╱ : PIXELS THAT CONTROL CONTROL CIRCUIT OF TARGET PIXEL

□ : PIXELS THAT DO NOT CONTROL CONTROL CIRCUIT OF TARGET PIXEL

FIG. 20C

CORRELATION MAP OF PIXEL B

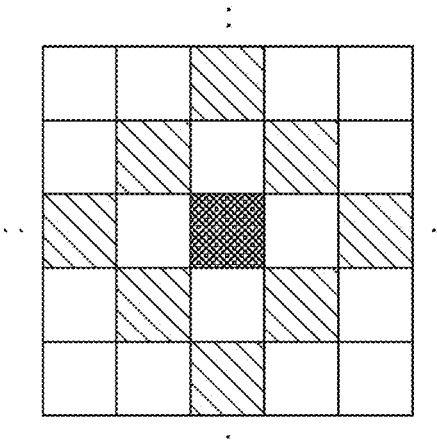

■ : TARGET PIXEL

╱ : PIXELS THAT CONTROL CONTROL CIRCUIT OF TARGET PIXEL

□ : PIXELS THAT DO NOT CONTROL CONTROL CIRCUIT OF TARGET PIXEL

FIG. 21

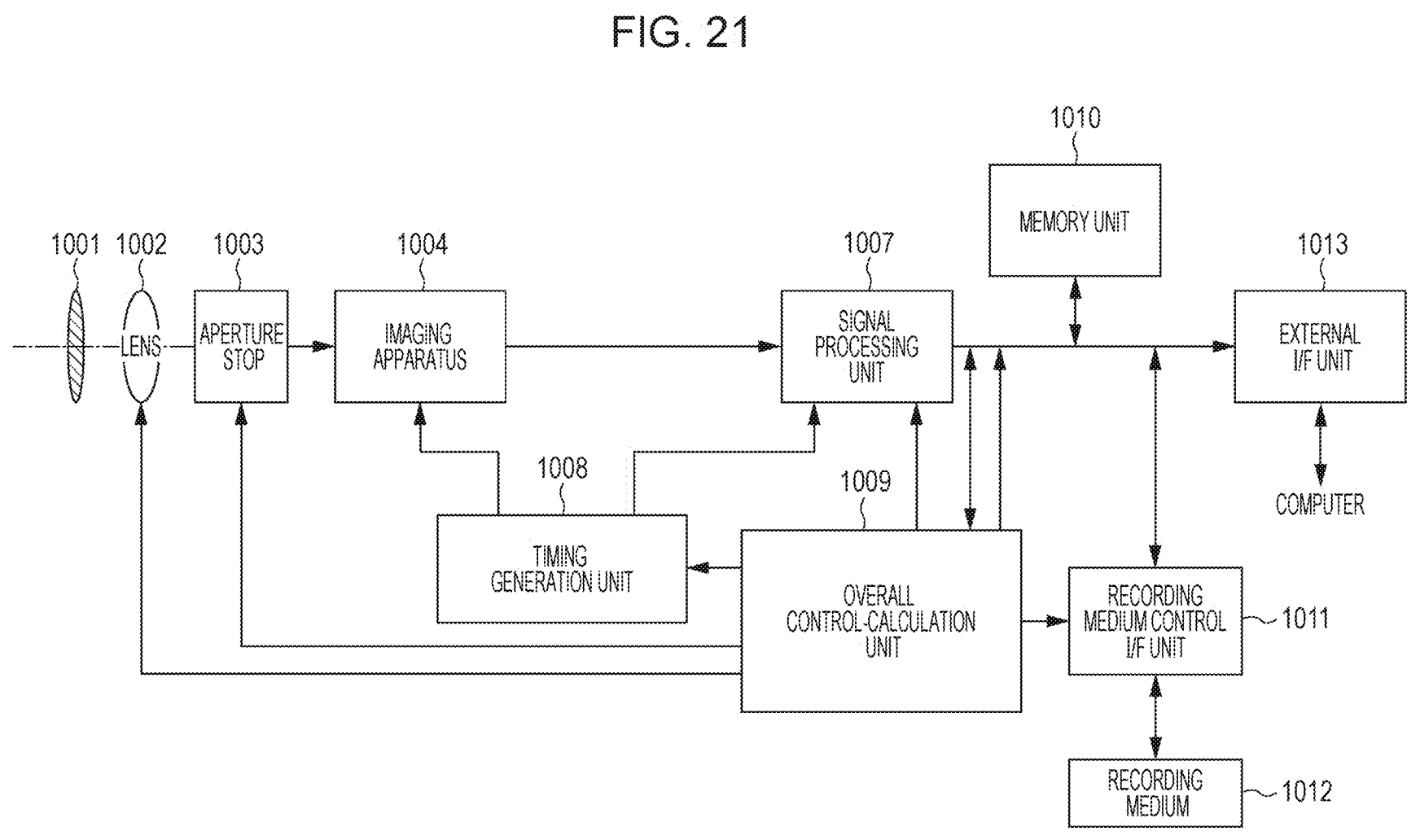

1013 EXTERNAL I/F UNIT

COMPUTER

1010 MEMORY UNIT

1011 RECORDING MEDIUM CONTROL I/F UNIT

1012 RECORDING MEDIUM

1007 SIGNAL PROCESSING UNIT

1009 OVERALL CONTROL-CALCULATION UNIT

1008 TIMING GENERATION UNIT

1004 IMAGING APPARATUS

1003 APERTURE STOP 1001 1002 LENS

FIG. 24

PHOTOELECTRIC CONVERSION APPARATUS

CROSS-REFERENCE TO RELATED APPLICATIONS

This application is a Continuation of International Patent Application No. PCT/JP2023/002358, filed Jan. 26, 2023, which claims the benefit of Japanese Patent Application No. 2022-018105, filed Feb. 8, 2022, both of which are hereby incorporated by reference herein in their entirety.

TECHNICAL FIELD

The present invention relates to a photoelectric conversion apparatus and a photoelectric conversion system.

BACKGROUND ART

A Time-of-Flight (TOF) method is frequently used in measurement of the distance to a target object to be measured. Japanese Patent Laid-Open No. 2014-059302 discloses a TOF ranging apparatus using avalanche photodiodes (APDs). The TOF ranging apparatus divides multiple adjacent APDs into groups and outputs a pulse signal when the APDs of a certain number or more, among the APDs in the groups, detect signals at close timings. This enables the signals having high temporal and spatial correlation to be selectively detected to suppress the influence of the signals caused by ambient light, which have low temporal and spatial correlation.

CITATION LIST

Patent Literature

PTL 1 Japanese Patent Laid-Open No. 2014-059302

However, in Japanese Patent Laid-Open No. 2014-059302, the division of the multiple APDs into groups has a problem in reduction in spatial resolution of a detection apparatus.

In order to resolve the above problem, it is an object of the present invention to provide a photoelectric conversion apparatus and a photoelectric conversion system, which achieve both high spatial resolution and suppression of aliasing.

SUMMARY OF INVENTION

One aspect of the present invention is a photoelectric conversion apparatus including a pixel region including multiple pixels arranged in an array pattern. The multiple pixels include a first pixel and a second pixel. The first pixel includes a first photoelectric converter, a first detection circuit that outputs a first detection signal based on a photon incident on the first photoelectric converter, a first output circuit that outputs a first pixel signal to outside of the pixel in accordance with the first detection signal, and a first control circuit that controls whether the first detection signal is input into the first output circuit. The second pixel includes a second photoelectric converter, a second detection circuit that outputs a second detection signal based on a photon incident on the second photoelectric converter, a second output circuit that outputs a second pixel signal to outside of the pixel in accordance with the second detection signal, and a second control circuit that controls whether the second detection signal is input into the second output circuit. The first control circuit controls whether the first detection signal is input into the first output circuit in accordance with the second detection signal.

Further features of the present invention will become apparent from the following description of exemplary embodiments with reference to the attached drawings.

BRIEF DESCRIPTION OF DRAWINGS

FIG. 5A to FIG. 5C are schematic diagrams illustrating driving of the pixel circuit of the photoelectric conversion apparatus according to the embodiment.

FIG. 13 is a circuit diagram of one pixel according to a third embodiment.

FIG. 19A is a diagram illustrating the control relationship of a pixel array according to a fifth embodiment.

FIG. 19B is a diagram illustrating the control relationship of the pixel array according to the fifth embodiment.

FIG. 19C is a diagram illustrating the control relationship of the pixel array according to the fifth embodiment.

FIG. 20A is a diagram illustrating the control relationship of a pixel array according to a modification of the fifth embodiment.

FIG. 20B is a diagram illustrating the control relationship of the pixel array according to the modification of the fifth embodiment.

FIG. 20C is a diagram illustrating the control relationship of the pixel array according to the modification of the fifth embodiment.

FIG. 21 is a functional block diagram of a photoelectric conversion system according to a sixth embodiment.

FIG. 24 is a functional block diagram of a photoelectric conversion system according to a ninth embodiment.

DESCRIPTION OF EMBODIMENTS

Figure 1:
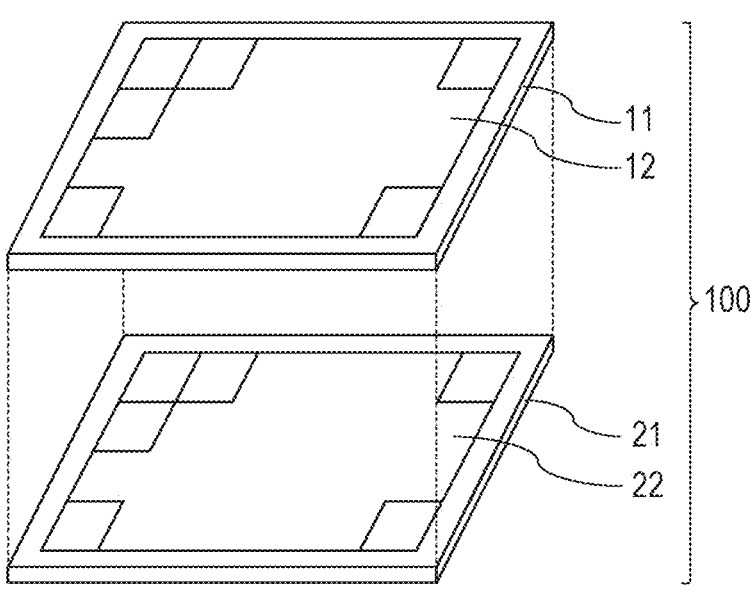
FIG. 1 is a diagram schematically illustrating the configuration of a photoelectric conversion apparatus according to an embodiment.

The embodiments described below embody the technical idea of the present invention and do not intend to limit the present invention. The sizes and the positional relationship of members illustrated in the respective drawings may be exaggerated in order to clarify the description. The same reference numerals are used in the following description to identify the same components and a description of such components may be omitted.

The embodiments of the present invention will herein be described in detail with reference to the drawings. Terms indicating specific directions and positions (for example, "top", "bottom", "right", "left", and other terms including theses terms) are used in the following description, if desired. These terms are used to facilitate understanding of the embodiments with reference to the drawings and the technical scope of the present invention is not limited by the meanings of these terms.

In the present description, a plan view means viewing something from a direction vertical to the incident plane of light of a semiconductor layer. A cross-sectional view means a plane along the direction vertical to the incident plane of light of the semiconductor layer. When the incident plane of light of the semiconductor layer is microscopically a rough surface, the plan view is defined with respect to the incident plane of light of the semiconductor layer when the incident plane of light of the semiconductor layer is macroscopically viewed.

In the following description, the anode of an avalanche photodiode (APD) is set to a fixed electric potential and a signal is extracted from the cathode side. Accordingly, a first conductivity type semiconductor region having electric charge of the same polarity as that of the signal charge as majority carrier is an N-type semiconductor region, and a second conductivity type semiconductor region having electric charge of a polarity different from that of the signal charge as majority carrier is a P-type semiconductor region. The present invention comes into effect even when the cathode of the APD is set to the fixed electrical potential and a signal is extracted from the anode side. In this case, the first conductivity type semiconductor region having electric charge of the same polarity as that of the signal charge as majority carrier is the P-type semiconductor region, and the second conductivity type semiconductor region having electric charge of a polarity different from that of the signal charge as majority carrier is the N-type semiconductor region. Although the case in which one node of the APD is set to the fixed electrical potential is described below, the electrical potentials of both nodes of the APD may be varied.

In the present description, when a term of "impurity concentration" is simply used, the impurity concentration means the net impurity concentration resulting from subtraction of the amount compensated by opposite conductivity type impurities. In other words, the "impurity concentration" indicates the net doping concentration. A region in which the P-type additional impurity concentration is higher than the N-type additional impurity concentration is the P-type semiconductor region. Conversely, a region in which the N-type additional impurity concentration is higher than the P-type additional impurity concentration is the N-type semiconductor region.

A configuration common to the respective embodiments of photoelectric conversion apparatuses and methods of driving the photoelectric conversion apparatuses according to the present invention will now be described with reference to FIG. 1 to FIG. 5C.

FIG. 1 is a diagram illustrating the configuration of a multilayer photoelectric conversion apparatus 100 according to an embodiment of the present invention. The photoelectric conversion apparatus 100 is composed of a sensor substrate 11 and a circuit substrate 21. The two substrates of the sensor substrate 11 and the circuit substrate 21 are laminated and are electrically connected to each other. The sensor substrate 11 has a first semiconductor layer having photoelectric conversion elements 102 described below and a first wiring structure. The circuit substrate 21 has a second semiconductor layer having circuits, such as signal processors 103 described below, and a second wiring structure. The photoelectric conversion apparatus 100 is composed of the second semiconductor layer, the second wiring structure, the first wiring structure, and the first semiconductor layer, which are laminated in this order. The photoelectric conversion apparatuses described in the respective embodiments are back-illuminated photoelectric conversion apparatuses in which light is incident from a first surface and the circuit substrate is arranged on a second surface.

Although the sensor substrate 11 and the circuit substrate 21 are described below as diced chips, the sensor substrate 11 and the circuit substrate 21 are not limited to the chips. For example, each substrate may be a wafer. Each substrate may be diced after being laminated in a wafer state. Alternatively, each substrate may be chipped and, then, the chips may be laminated and joined.

A pixel region 12 is arranged on the sensor substrate 11. A circuit region 22 in which a signal detected in the pixel region 12 is processed is arranged on the circuit substrate 21.

Figure 2:
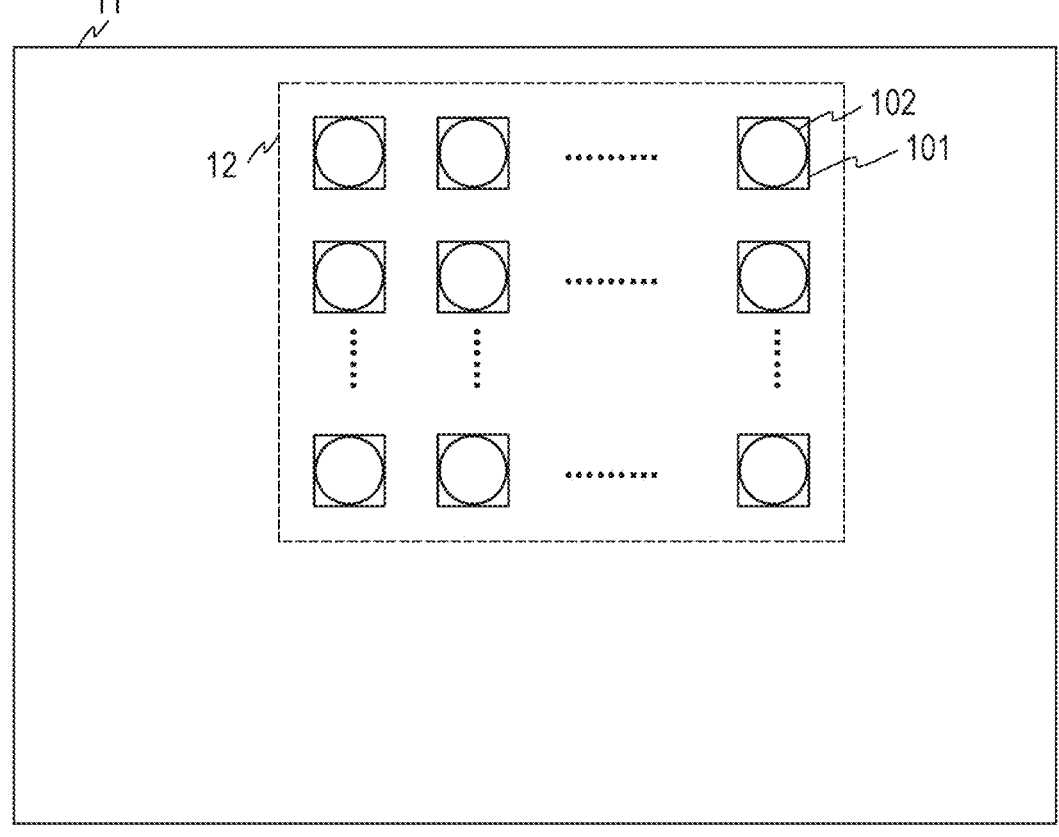
FIG. 2 is a diagram schematically illustrating a sensor substrate of the photoelectric conversion apparatus according to the embodiment.

FIG. 2 is a diagram illustrating an example of arrangement on the sensor substrate 11. Pixels 101 each including the photoelectric conversion element 102 including an APD are arranged in a two-dimensional array in a plan view to form the pixel region 12.

Although the pixel 101 is typically a pixel for forming an image, the pixel 101 may not necessarily form an image when the pixel 101 is used in Time of Flight (TOF). In other words, the pixel 101 may be a pixel for measuring the time when light reaches the pixel 101 and the amount of light.

Figure 3:
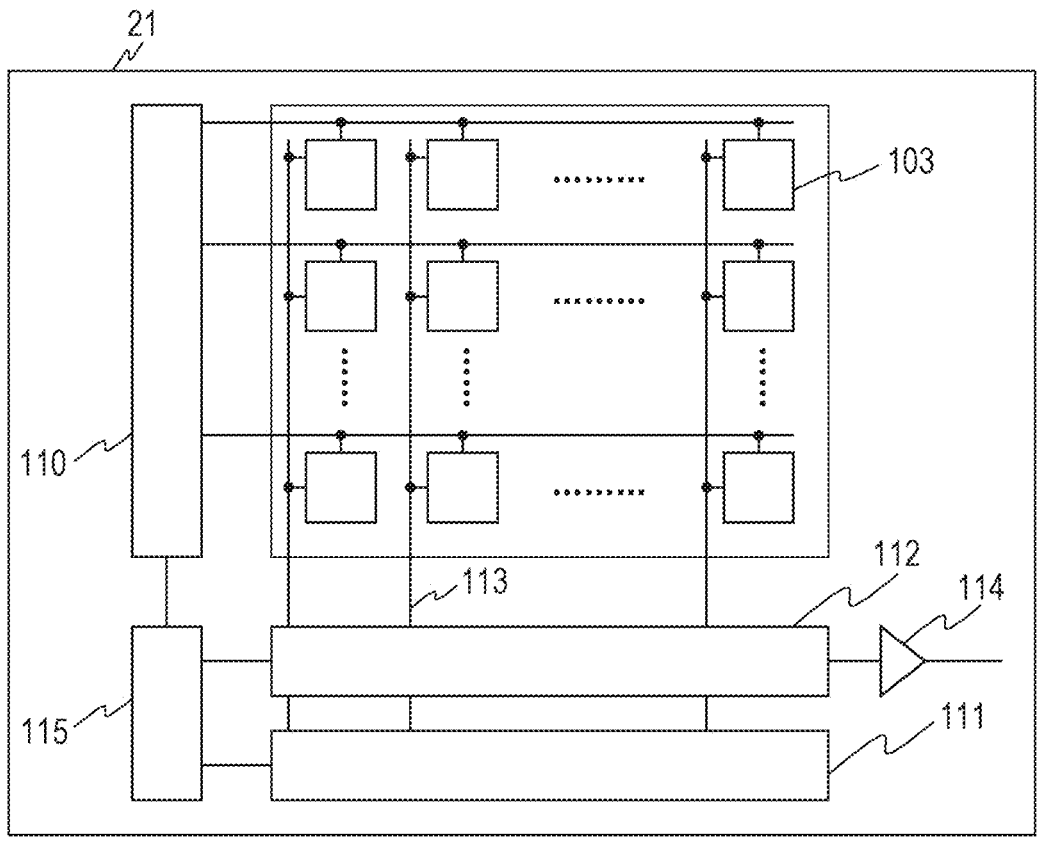
FIG. 3 is a diagram schematically illustrating a circuit substrate of the photoelectric conversion apparatus according to the embodiment.

FIG. 3 is a diagram illustrating the configuration of the circuit substrate 21. The circuit substrate 21 includes the signal processors 103 that process electric charge subjected to photoelectric conversion in the photoelectric conversion elements 102 in FIG. 2, a column circuit 112, a control pulse generator 115, a horizontal scanning circuit portion 111, signal lines 113, and a vertical scanning circuit portion 110.

The photoelectric conversion elements 102 in FIG. 2 and the signal processors 103 in FIG. 3 are electrically connected to each other via a connection line provided for each pixel.

The vertical scanning circuit portion 110 supplies a control pulse to each pixel upon reception of the control pulse supplied from the control pulse generator 115. Logic circuits, such as a shift register and an address decoder, are used in the vertical scanning circuit portion 110.

The signal output from the photoelectric conversion element 102 of the pixel is processed in the signal processor 103. A counter, a memory, and so on are provided in the signal processor 103 and digital values are held in the memory.

The horizontal scanning circuit portion 111 supplies the control pulse for sequentially selecting each column to the signal processors 103 in order to read out the signal from the memory of each pixel, in which the digital signal is held.

Signals are supplied from the signal processors 103 of the pixels selected by the vertical scanning circuit portion 110 to the signal line 113 for the selected column.

The signals supplied to the signal line 113 are supplied to a recording unit or a signal processor outside the photoelectric conversion apparatus 100 via an output circuit 114.

Referring to FIG. 2, the photoelectric conversion elements in the pixel region may be one-dimensionally arrayed. The function of the signal processor may not necessarily be provided for each photoelectric conversion element. For example, one signal processor may be shared between the multiple photoelectric conversion elements and the signal processing may be sequentially performed.

As illustrated in FIG. 2 and FIG. 3, the multiple signal processors 103 are arranged in an area overlapped with the pixel region 12 in a plan view. The vertical scanning circuit portion 110, the horizontal scanning circuit portion 111, the column circuit 112, the output circuit 114, and the control pulse generator 115 are arranged so as to be overlapped between the edges of the sensor substrate 11 and the edges of the pixel region 12 in a plan view. In other words, the sensor substrate 11 has the pixel region 12 and a non-pixel region arranged around the pixel region 12, and the vertical scanning circuit portion 110, the horizontal scanning circuit portion 111, the column circuit 112, the output circuit 114, and the control pulse generator 115 are arranged in areas overlapped with the non-pixel region in a plan view.

Figure 4:
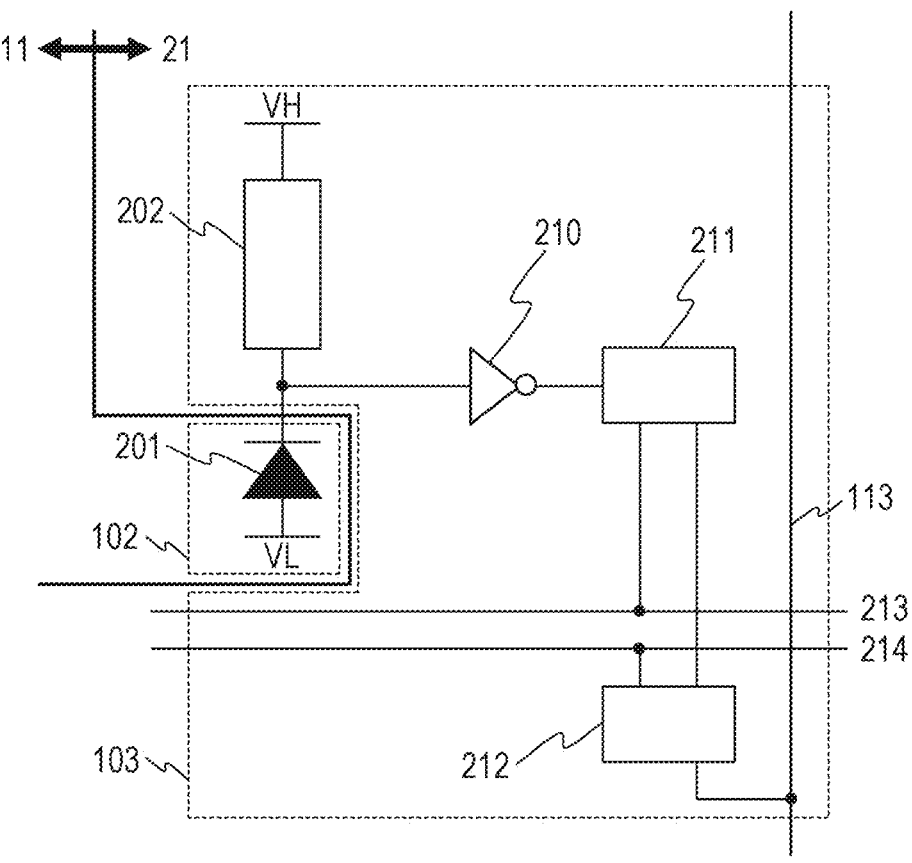
FIG. 4 illustrates an example of the configuration of a pixel circuit of the photoelectric conversion apparatus according to the embodiment.

FIG. 4 is an example of a block diagram including the equivalent circuits of FIG. 2 and FIG. 3.

Referring to FIG. 4, the photoelectric conversion element 102 including an APD 201 is provided on the sensor substrate 11 and the other members are provided on the circuit substrate 21.

The APD 201 is a photoelectric converter that generates a charge pair corresponding to incident light through photoelectric conversion. Voltage VL (first voltage) is supplied to the anode of the APD 201. Voltage VH (second voltage) higher than the voltage VL supplied to the anode is supplied to the cathode of the APD 201. Reverse bias voltage causing the APD 201 to perform an avalanche multiplication operation is supplied to the anode and the cathode. In the state in which such voltages are supplied, the electric charge caused by the incident light causes the avalanche multiplication to generate avalanche current.

In the state in which the reverse bias voltage is supplied, the APD 201 is operated in a Geiger mode in which the APD 201 is operated in a state in which the potential difference between the anode and the cathode is greater than breakdown voltage and in a linear mode in which the APD 201 is operated in a state in which the potential difference between the anode and the cathode is near the breakdown voltage or lower.

The APD operated in the Geiger mode is called a single photon avalanche diode (SPAD). For example, the voltage VL (the first voltage) is −30 V and the voltage VH (the second voltage) is 1 V. The APD 201 may be operated in the linear mode or in the Geiger mode. Since the potential difference is greater than that of the APD in the linear mode and the effect of the breakdown voltage is noticeable in the SPAD, the APD is preferably the SPAD.

A quench element 202 is connected to a power supply that supplies the voltage VH and the APD 201. The quench element 202 functions as a load circuit (a quench circuit) in the signal multiplication through the avalanche multiplication and suppresses the voltage to be supplied to the APD 201 to suppress the avalanche multiplication (a quench operation). In addition, the quench element 202 causes current corresponding to the amount of voltage drop in the quench operation to flow to return the voltage to be supplied to the APD 201 to the voltage VH (a recharge operation).

The signal processor 103 includes a waveform shaper 210, a counter circuit 211, and a selection circuit 212. In the present description, it is sufficient for the signal processor 103 to include any one of the waveform shaper 210, the counter circuit 211, and the selection circuit 212.

The waveform shaper 210 shapes potential change of the cathode of the APD 201, which occurs in detection of a photon, to output a pulse signal. For example, an inverter circuit is used as the waveform shaper 210. Although the example is indicated in FIG. 4 in which one inverter is used as the waveform shaper 210, a circuit in which multiple inverters are connected in series may be used or another circuit having the waveform shaping effect may be used.

The counter circuit 211 counts the pulse signals supplied from the waveform shaper 210 to hold the count value. When a control pulse pRES is supplied via a drive line 213, the signal held in the counter circuit 211 is reset.

A control pulse pSEL is supplied from the vertical scanning circuit portion 110 in FIG. 3 to the selection circuit 212 via a drive line 214 in FIG. 4 (not illustrated in FIG. 3) and electrical connection and non-connection between the counter circuit 211 and the signal line 113 are switched in response to the control pulse pSEL. The selection circuit 212 includes, for example, a buffer circuit for outputting a signal and so on.

A switch, such as a transistor, may be arranged between the quench element 202 and the APD 201 or between the photoelectric conversion element 102 and the signal processor 103 to switch the electrical connection. Similarly, the supply of the voltage VH or the voltage VL, which is to be supplied to the photoelectric conversion element 102, may be electrically switched using a switch, such as a transistor.

The configuration using the counter circuit 211 is indicated in the present embodiment. However, the photoelectric conversion apparatus 100 may acquire a pulse detection timing using a time to digital converter (TDC) and a memory, instead of the counter circuit 211. At this time, the timing when the pulse signal output from the waveform shaper 210 occurs is converted into the digital signal by the TDC. A control pulse pREF (a reference signal) is supplied from the vertical scanning circuit portion 110 in FIG. 3 to the TDC via the drive line for measurement of the timing of the pulse signal. The TDC acquires a signal when the input timing of the signal output from each pixel via the waveform shaper 210 is used as a relative time with respect to the control pulse pREF as the digital signal.

FIG. 5A to FIG. 5C are diagrams schematically illustrating the relationship between the operation of the APD and an output signal.

FIG. 5A is a diagram selectively illustrating the APD 201, the quench element 202, and the waveform shaper 210 in FIG. 4. Here, the input side of the waveform shaper 210 is a node A and the output side thereof is a node B. FIG. 5B indicates waveform change at the node A in FIG. 5A. FIG. 5C indicates waveform change at the node B in FIG. 5A.

The potential difference VH-VL is applied to the APD 201 in FIG. 5A during a period from a time t0 to a time t1. When the photon is incident on the APD 201 at the time t1, the avalanche multiplication occurs at the APD 201 and the avalanche multiplication current flows through the quench element 202 to decrease the voltage at the node A. When the voltage drop is further increased and the potential difference to be applied to the APD 201 is decreased, the avalanche multiplication at the APD 201 is stopped as at a time t2 and the voltage level at the node A is not decreased below a certain value. Then, current for compensating the voltage drop flows through the node A from the voltage VL during a period from the time t2 to a time t3 and the node A is statically set to the original potential level at the time t3. At this time, the portion where the output waveform exceeds a predetermined threshold value at the node A is subjected to the waveform shaping in the waveform shaper 210 and is output as a signal at the node B.

The arrangement of the signal lines 113 and the arrangement of the column circuit 112 and the output circuit 114 are not limited the ones in FIG. 3. For example, the signal lines 113 may extend in the row direction and the column circuit 112 may be arranged in a direction to which the signal lines 113 extend.

Photoelectric conversion apparatuses of the respective embodiments will be described.

First Embodiment

A photoelectric conversion apparatus according to a first embodiment will now be described with reference to FIG. 6 to FIG. 10.

Figure 6:
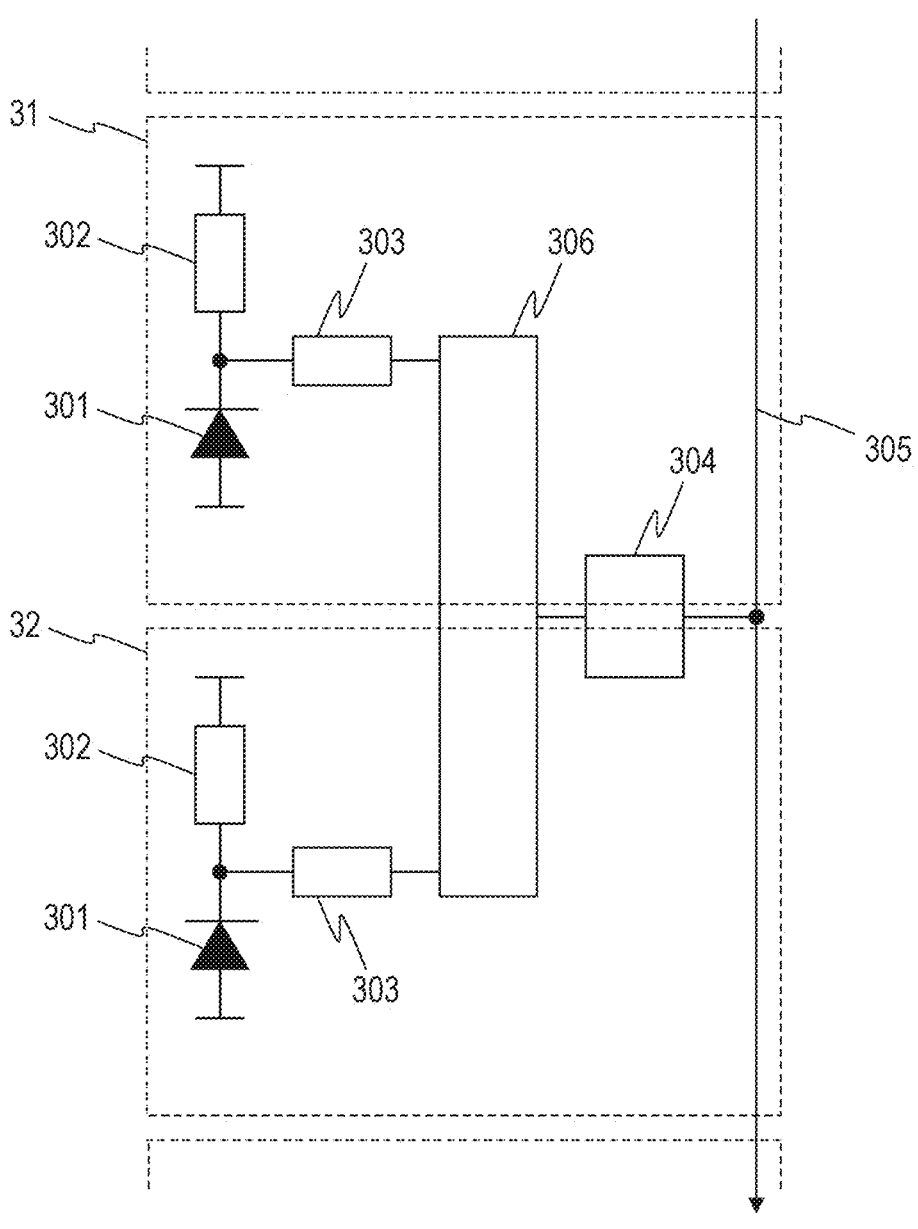
FIG. 6 is a block diagram of two pixels according to a comparative example of a first embodiment.

The circuit configuration of pixels in a comparative example of a photoelectric conversion apparatus according to the first embodiment will be described with reference to FIG. 6. Each of a first pixel 31 and a second pixel 32 illustrated in FIG. 6 includes an APD 301, a quench circuit 302, and a signal detection circuit 303. In addition, a readout circuit 304, a signal line 305, and a control circuit 306 common to the first pixel 31 and the second pixel 32 are provided.

In each pixel, the APD 301 is connected to the quench circuit 302 and an output terminal of the APD 301 is connected to the signal detection circuit 303. A detection signal based on the photons subjected to the photoelectric conversion in the APDs 301 of the first pixel 31 and the second pixel 32 is supplied to the signal line 305 as a pixel signal via the readout circuit 304 and the control circuit 306 common to the first pixel 31 and the second pixel 32. The control circuit 306 controls whether the pulse signal is to be supplied to the readout circuit 304 based on the output signals from the signal detection circuits 303 of the first pixel 31 and the second pixel 32. The control circuit 306 is composed of, for example, a combination circuit and a sequential circuit.

An operation to supply the pulse signal to the readout circuit 304 when the signals based on the photons are detected simultaneously or at close timings at the first pixel 31 and the second pixel 32 is exemplified as an example of the operations of the control circuit 306. The operation is performed to selectively read out a photon signal having high temporal and spatial correlation and to filter the photon signal having low temporal and spatial correlation. In the TOF method, the signal light has high temporal and spatial correlation and ambient light or dark current, which is an alias, has low temporal and spatial correlation because the ambient light or the dark current is incident at random. Accordingly, filtering the signal having low temporal and spatial correlation enables the signal light and the ambient light or the dark current to be efficiently discriminated. However, since the number of the pixel signals supplied to the signal line 305 is smaller than the number of the APDs 301 when the circuit configuration illustrated in FIG. 6 is adopted, there is a problem in reduction in spatial resolution.

Figure 7:
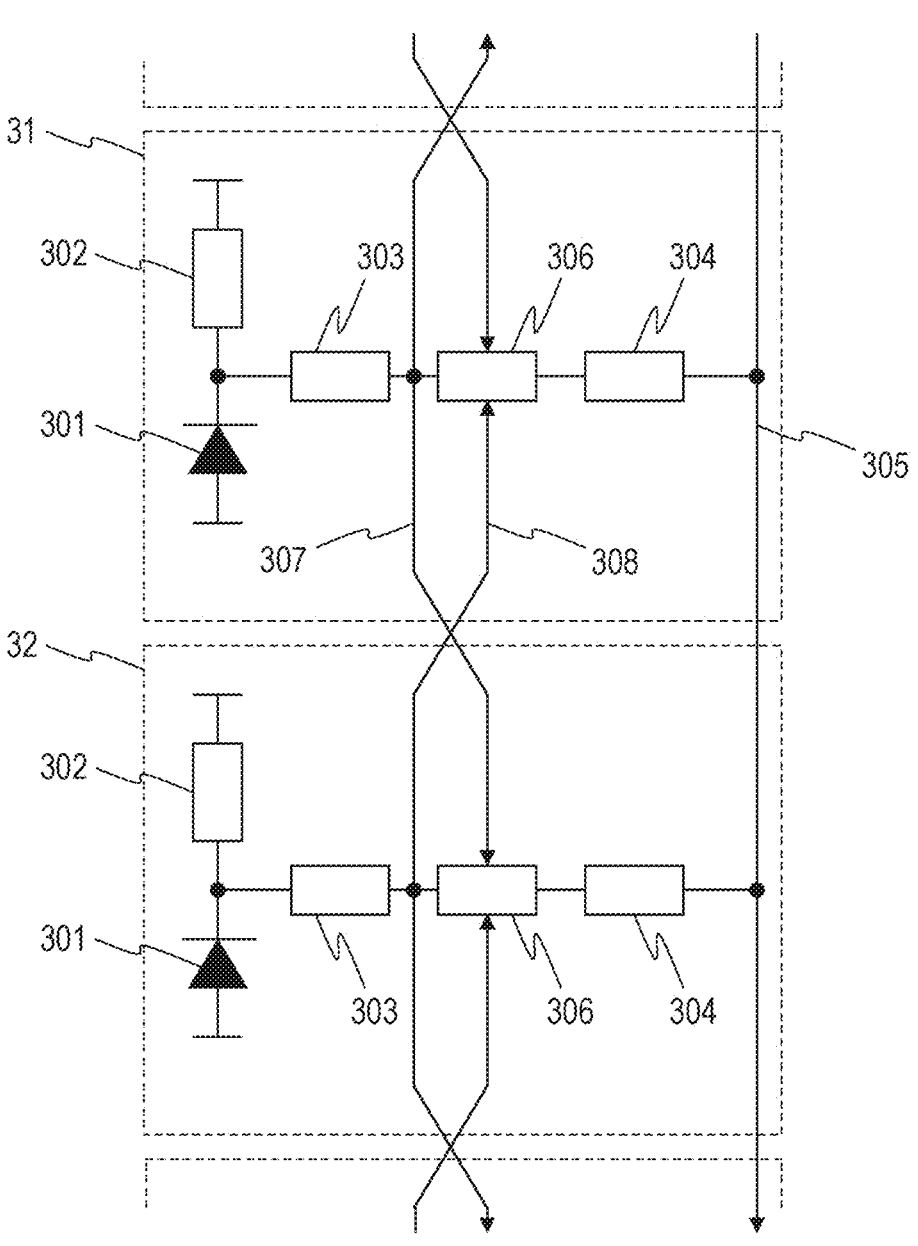
FIG. 7 is a block diagram of two pixels according to the first embodiment.

FIG. 7 is an example of a block diagram of two pixels in a photoelectric conversion apparatus according to the present embodiment. The circuit configuration illustrated in FIG. 7 differs from the circuit configuration in related art illustrated in FIG. 6 in that the readout circuit 304 and the control circuit 306 are provided for each of the first pixel 31 and the second pixel 32.

In the photoelectric conversion apparatus according to the present embodiment, the control circuit 306 (a first control circuit) of the first pixel 31 controls whether an output (a first detection signal) from the signal detection circuit 303 (a first detection circuit) of the first pixel 31 is input into the readout circuit 304 (a first output circuit) of the first pixel 31 based on an output (a second detection signal) from the signal detection circuit 303 (a second detection circuit) of the second pixel 32, which is input via a control line 308. The control circuit 306 (a second control circuit) of the second pixel 32 controls whether an output from the signal detection circuit 303 of the second pixel 32 is input into the readout circuit 304 (a second output circuit) of the second pixel 32 based on an output from the signal detection circuit 303 of the first pixel 31, which is input via a control line 307.

An operation to supply the pulse signal, which is a first pixel signal, to the readout circuit 304 of the first pixel 31 when the first pixel 31 and the second pixel 32 detect the photons simultaneously or at close timings is exemplified as an example of the operations of the control circuit 306 of the first pixel 31. Similarly, an operation to supply the pulse signal, which is a second pixel signal, to the readout circuit 304 of the second pixel 32 when the first pixel 31 and the second pixel 32 detect the photon signals simultaneously or at close timings is exemplified as an example of the operations of the control circuit 306 of the second pixel 32. The control circuit 306 of the first pixel 31 may control the output of the signal based on the output from the signal detection circuit 303 of a pixel other than the second pixel 32. The control circuit 306 of the second pixel 32 may control the output of the signal based on the output from the signal detection circuit 303 of a pixel other than the first pixel 31. A photon detection timing at which the pulse signal is supplied to the readout circuit 304 at each pixel will be described below.

Since the adoption of the circuit configuration illustrated in FIG. 7 enables the strength of the temporal and spatial correlation of the photon signal detected at the APD 301 of each pixel to be determined for each pixel, it is possible to suppress the alias without reducing the spatial resolution.

Figure 8:
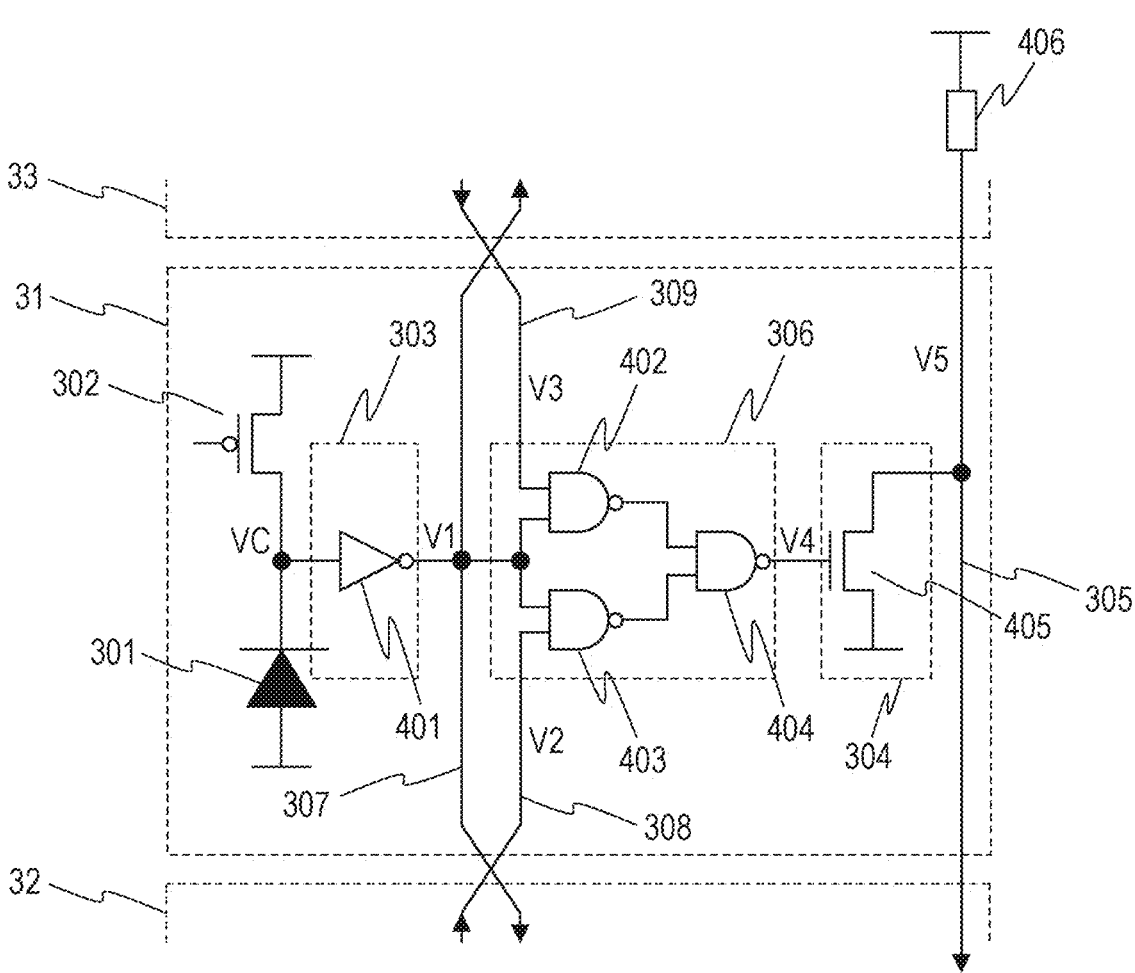
FIG. 8 is a circuit diagram of one pixel according to the first embodiment.

FIG. 8 illustrates an example of the circuit diagram of one pixel of the present embodiment.

The first pixel 31 of a photoelectric conversion apparatus in which the first pixel 31, the second pixel 32, and a third pixel 33 are one-dimensionally arranged in an array pattern is exemplified for description. The APD 301 (a first photoelectric converter) of the first pixel 31 is connected to the quench circuit 302, which is a first quench element composed of a P-type transistor. The quench circuit 302 is an element provided to control the current flowing through the APD 301 and, for example, a resistive element, a capacitive element, or a circuit composed of multiple transistors that are combined may be used as the quench circuit 302. Although the signal detection circuit 303 includes an inverter circuit 401 that performs the waveform shaping, for example, a resistive element, a capacitive element, or a circuit composed of multiple transistors that are combined may be used as the signal detection circuit 303. A width td of the pulse signal output from the signal detection circuit 303 is determined in accordance with the recovery time of the APD 301.

A pulldown circuit 405 composed of an N-type transistor is arranged in the readout circuit 304. The signal line 305 is reset to an "H" level via a pullup circuit 406 and is switched to an "L" level upon input of the pulse signal into the pulldown circuit 405.

The control circuit 306 includes a first logic circuit 402, a second logic circuit 403, and a third logic circuit 404. The first logic circuit 402, the second logic circuit 403, and the third logic circuit 404 in FIG. 8 are NAND circuits. For example, the first logic circuit 402 calculates negative AND of the output signal from the inverter circuit 401 of the first pixel 31 and the output signal from the inverter circuit 401 of the third pixel 33. Similarly, the second logic circuit 403 calculates negative AND of the output signal from the inverter circuit 401 of the first pixel 31 and the output signal from the inverter circuit 401 of the second pixel 32. The third logic circuit 404 calculates negative AND of the output signal from the first logic circuit 402 and the output signal from the second logic circuit 403.

An example of the operations of the control circuit 306 is described. The control circuit 306 supplies the "H" level to the readout circuit 304 if at least one of the signals input from the adjacent second pixel 32 and the adjacent third pixel 33 is in the "H" level when the signal detection circuit 303 of the first pixel 31 outputs the "H" level. Accordingly, the signal detected at the first pixel 31 is determined to be a true signal if either of the second pixel 32 and the third pixel 33 detects the photon during a period from a time t0−td to a time t0+td when the first pixel 31 detects the photon at a certain time t0. In other words, the period of 2td, which corresponds to the two pulse signals output from the signal detection circuit 303, is considered as the close timing described above. The first pixel 31 is capable of supplying the pulse signal to the readout circuit 304. The output from the signal detection circuit 303 of the first pixel 31 is connected to the control circuits 306 of the adjacent second pixel 32 and the adjacent third pixel 33 via a control line 309. Arranging such a pixel circuit in an array pattern like a chain enables the strength of the temporal and spatial correlation of the signal based on the photon detected at each pixel to be determined for each pixel to discriminate the true signal from the alias.

The configuration of the control circuit 306 is not limited to the one illustrated in FIG. 8 and it is sufficient for the control circuit 306 to have a configuration enabling the same operation. For example, the first logic circuit 402 and the second logic circuit 403 may be AND circuits and the third logic circuit 404 may be an OR circuit.

Figure 9:
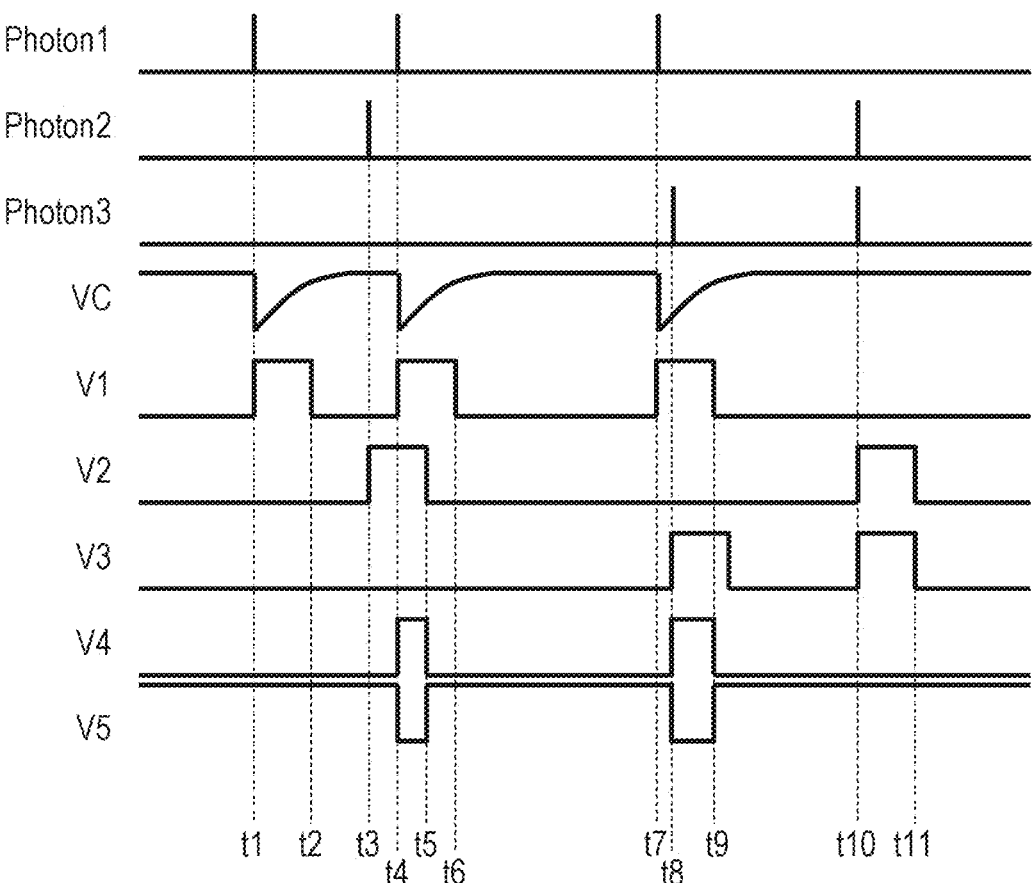
FIG. 9 is a timing chart of driving of the pixels according to the first embodiment.

FIG. 9 is a timing chart indicating the operation of the pixels in the photoelectric conversion apparatus according to the present embodiment. A cathode potential of the APD 301 in FIG. 8 is denoted by VC, the potential of an output terminal of the signal detection circuit 303 is denoted by V1, the potential of the control line 308 is denoted by V2, the potential of the control line 309 is denoted by V3, the potential of an output terminal of the control circuit 306 is denoted by V4, and the potential output to the signal line 305 is denoted by V5. Photon 1, Photon 2, and Photon 3 indicate timings when the photons are incident on the APDs of the first pixel 31, the second pixel 32, and the third pixel 33, respectively.

The cathode potential VC is the potential of the output terminal of the APD 301 and is varied through the photoelectric conversion that occurs at the timings of Photon 1 at times t1, t4, and t7.

V1 indicates the signal waveform after the change of the cathode potential VC is subjected to the waveform shaping by the inverter circuit 401. Similarly, V2 is a pulse generated at the timing of Photon 2 and V3 is a pulse generated at the timing of Photon 3.

V4 is in the "H" level during a period in which V1 is in the "H" level and either of V2 and V3 is in the "H" level. V5 is inverting logic of V4.

V1 is in the "H" level during a period t1 to t2 due to Photon 1 incident on the APD 301 at the time t1. However, since the V2 and V3 are in the "L" level at close timings, V4 is not in the "H" level and a photon detection pulse is not supplied to V5.

In contrast, V1 is in the "H" level during a period t4 to t6 due to Photon 1 incident at a time t4. A period t3 to t4 is shorter than the width td described above and a time t3 is a time within a period t4−td to t4+td. In other words, since Photon 2 is incident at the time t3, which is a timing close to the time t4, and V2 is in the "H" level during a period t3 to t5, V4 is in the "H" level during a period t4 to t5 and the photon detection pulse is supplied to V5.

Similarly, since Photon 3 is incident at a time t8, which is a timing close to a time t7 at which Photon 1 is incident, and V3 is in the "H" level during a period t8 to t9, the photon detection pulse is supplied to V5 during the period t8 to t9. Although V2 and V3 are in the "H" level during a period t10 to t11 due to Photon 2 and Photon 3 incident at a time t10, V1 is not in the "H" level at close timings. Accordingly, the photon detection pulse is not supplied to V5 during this period.

The circuit configuration is adopted in the present embodiment, in which the signal when adjacent pixels have detected signals at close timings is considered as the true signal and the signal other than the true signal is considered as the alias. In contrast, a circuit configuration may be adopted in which, when the adjacent pixels have detected signals at close timings, the true signal and the alias are discriminated in consideration of the order of detection. For example, the signal that has been first detected may be considered as the alias and the signal that has been subsequently detected may be considered as the true signal.

Figure 10:
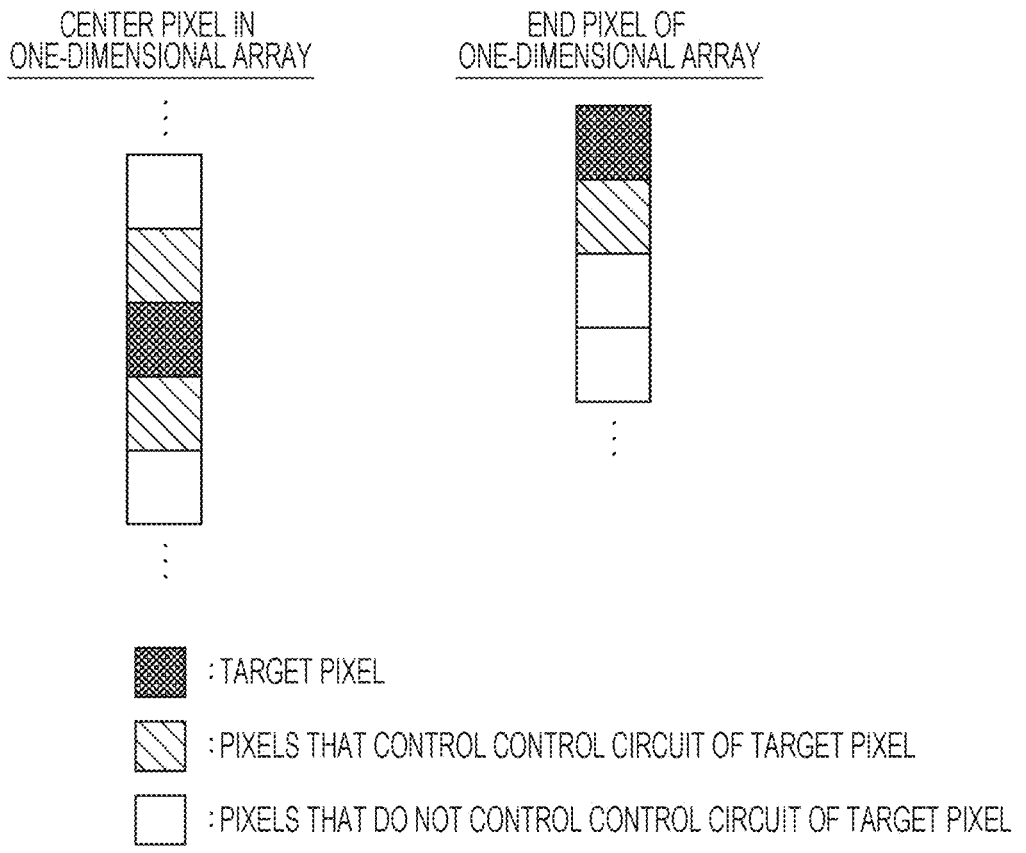
FIG. 10 is a diagram illustrating the control relationship of a pixel array according to the first embodiment.

FIG. 10 illustrates the control relationship of a pixel array in the photoelectric conversion apparatus according to the present embodiment.

When attention is given to a pixel that is arranged near the center of a one-dimensional array in which the pixels are arranged in the up and down direction, the control circuit of the target pixel is controlled by the up and down adjacent pixels. In the present embodiment, the control circuit of the target pixel is not controlled by the pixels other than the adjacent pixels.

When attention is given to a pixel that is arranged at the upper end of the one-dimensional array in which the pixels are arranged in the up and down direction, the control circuit of the target pixel is controlled by only the lower adjacent pixel. The number of adjacent pixels of the pixels arranged at the end portions of the array is smaller than that of the pixels arranged near the center of the array. Accordingly, the number of pixels controlling the control circuit of the target pixel is also decreased. When the control circuit of the target pixel is controlled by a small number of pixels, it is not possible to correctly detect the true signal or the possibility of outputting the alias is increased, compared with a case in which the target pixel is controlled using the pixels of a sufficient number. Accordingly, for example, an action is taken not to use the outermost pixels for image processing at subsequent stages.

Second Embodiment

A photoelectric conversion apparatus according to a second embodiment will now be described with reference to FIG. 11 and FIG. 12. The present embodiment differs from the first embodiment in the internal configurations of the signal detection circuit 303 and the control circuit 306. A description of points common to the first embodiment is omitted and the description mainly focuses on points different from the first embodiment.

Figure 11:
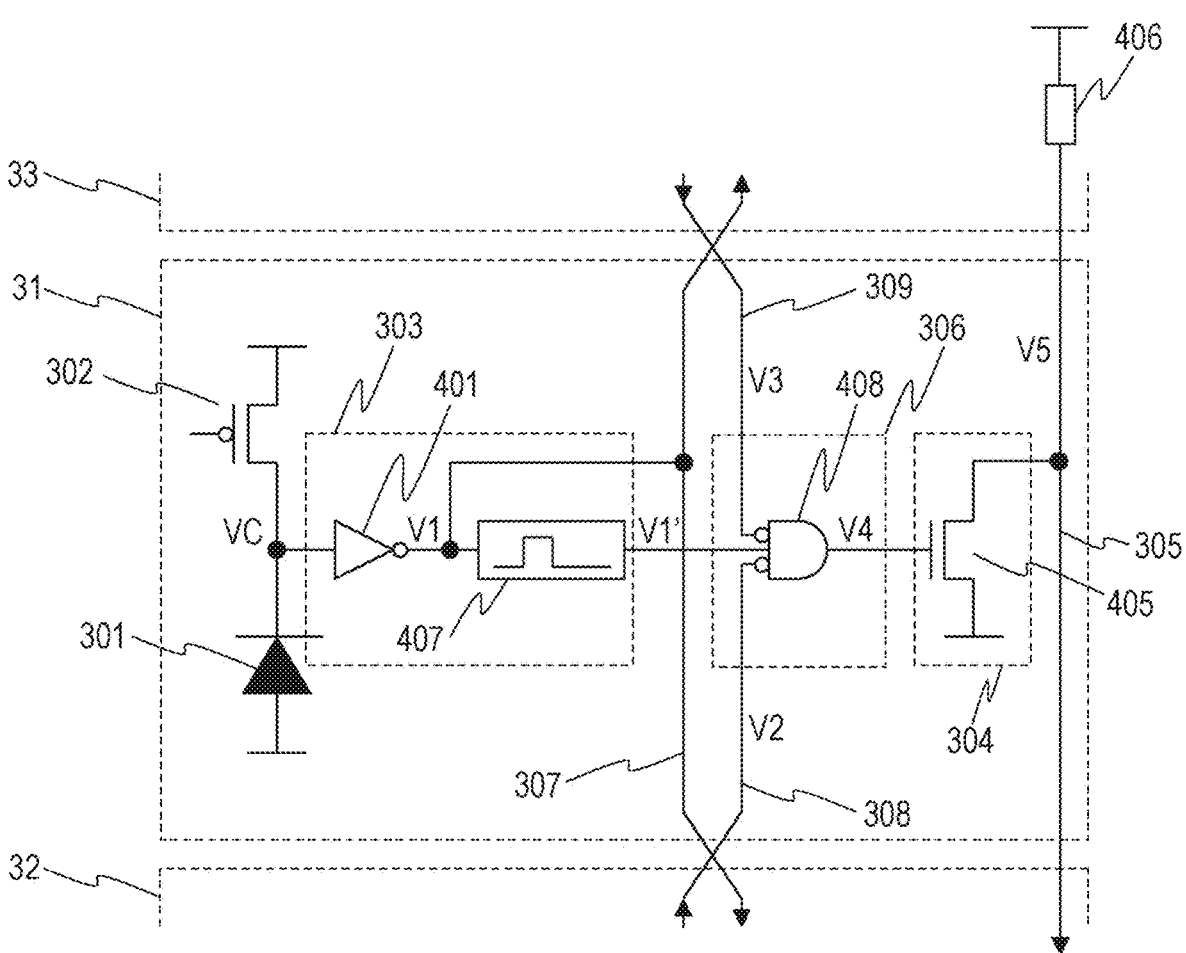
FIG. 11 is a circuit diagram of one pixel according to a second embodiment.

FIG. 11 illustrates an example of the circuit diagram of one pixel of the present embodiment. The first pixel 31 of the photoelectric conversion apparatus in which the first pixel 31, the second pixel 32, and the third pixel 33 are one-dimensionally arranged in an array pattern is exemplified for description, as in the first embodiment. The output signal from the APD 301 of the first pixel 31 is input into the first signal detection circuit 303. The first control circuit 306 controls whether the output from the first signal detection circuit 303 is input into the first readout circuit 304 in accordance with the outputs from the signal detection circuits 303 of the second pixel 32 and the third pixel 33.

The signal detection circuit 303 of the present embodiment includes the inverter circuit 401 and a pulse shortening circuit 407. The pulse shortening circuit 407 is a circuit that generates the pulse signal of a predetermined pulse width, which is shorter than the pulse width of an input signal, in accordance with the input signal. Although, for example, a monostable circuit is used, another combination circuit, a sequential circuit, a capacitive coupling element, or the like may be used. The output from the signal detection circuit 303 is divided into two systems. The output from the inverter circuit 401 is directly connected to the control line 307 and the output from the pulse shortening circuit 407 is input into the control circuit 306.

The control circuit 306 includes a logic circuit 408. The output signal from the pulse shortening circuit 407 is supplied to the readout circuit 304 only when both of the signals input via the control line 308 and the control line 309 are in the "L" level.

Figure 12:
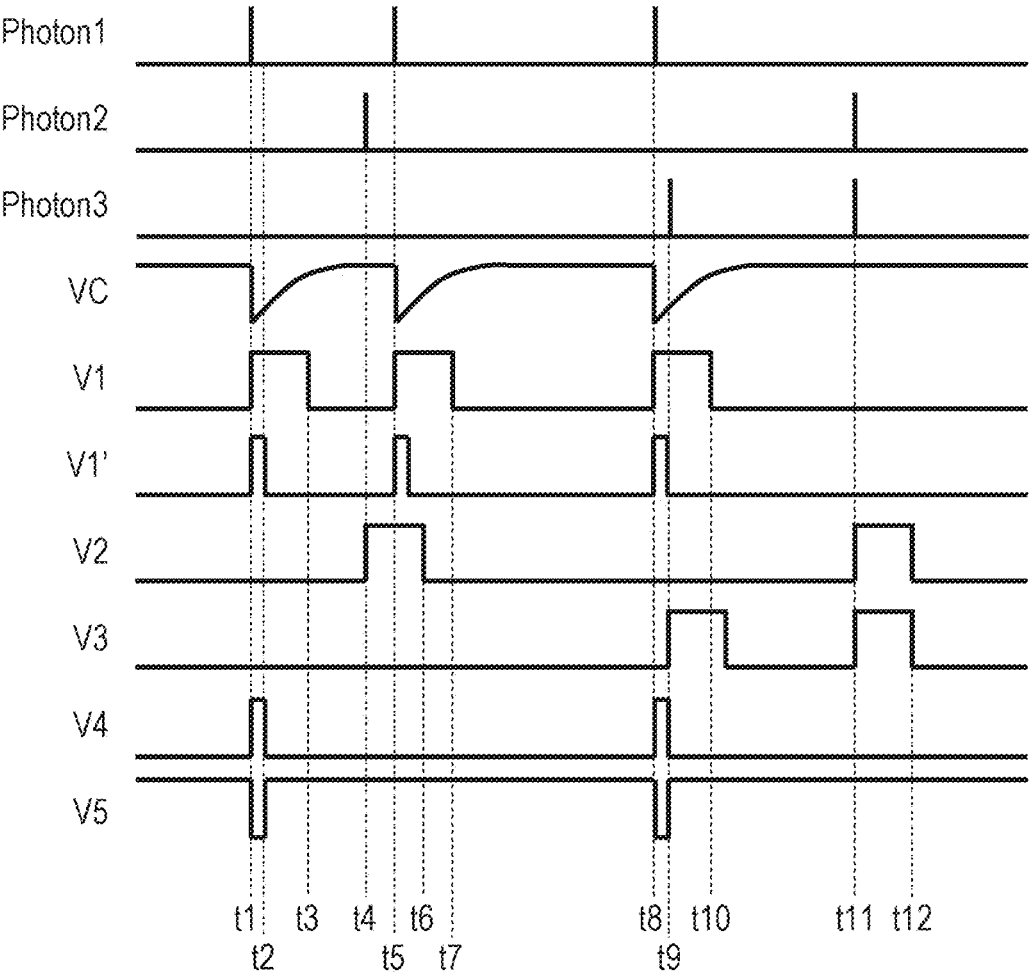
FIG. 12 is a timing chart of driving of the pixels according to the second embodiment.

FIG. 12 is a timing chart indicating the operation of the pixels in the photoelectric conversion apparatus according to the present embodiment. The potential of an output terminal of the inverter circuit 401 in FIG. 11 is denoted by V1 and the potential of an output terminal of the pulse shortening circuit 407 is denoted by V1'. A pulse wave is generated at the cathode potential VC in accordance with Photon 1 signal incident on the APD 301 at times t1, t5, and t8. V1 indicates the signal waveform after the change of the cathode potential VC is subjected to the waveform shaping by the inverter circuit 401. The pulse signal resulting from shortening of V1 is generated at V1'.

V1' is in the "H" level during a period t1 to t2 due to Photon 1 incident on the APD 301 at a time t1. Since V2 and V3 are in the "L" level at close timings, V4 is in the "H" level and the photon detection pulse is supplied to V5 during the period t1 to t2.

V1 is in the "H" level during a period t5 to t7 due to Photon 1 incident at a time t5. Since Photon 2 is incident at a close timing t4 and V2 is in the "H" level before V1, V4 is in the "L" level and the photon detection pulse is not supplied to V5.

Photon 3 is incident at a time t9, which is a timing close to a time t8 at which Photon 1 is incident, and V3 is in the "H" level. However, since the signal based on Photon 1 is detected during a period t8 to t9 in which V3 is in the "L" level, the photon detection pulse is supplied to V5 during the period t8 to t9.

In the present embodiment, the circuit configuration may be adopted in which, when the adjacent pixels have detected signals at close timings, the true signal and the alias are discriminated in consideration of the order of detection. For example, the signal that has been first detected is considered as the true signal and the signal that has been subsequently detected is considered as the alias.

In ranging using the TOF method, factors that can reduce the signal quality are considered, in addition to the alias caused by the ambient light or the dark current described above. For example, the signal quality may be reduced due to the alias, such as crosstalk between a light source and a light-receiving element, which is caused by reflection of emission light in the housing of a TOF module, or crosstalk between the pixels caused by an avalanche light emission phenomenon. The signal caused by such a crosstalk component is known to have very high temporal and spatial correlation.

In the present embodiment, the signal having low temporal and spatial correlation is read out as the true signal and the signal having high temporal and spatial correlation is considered as the alias to be filtered. This enables the alias caused by the crosstalk to be suppressed while realizing the high spatial resolution. In addition, the provision of the pulse shortening circuit 407 shortens the period in which the photons are discriminated as close timing. As a result, it is possible to filter the signal having higher temporal correlation as the alias.

The circuit configuration and the circuit operation realizing the present embodiment is not limited to the configuration described above. For example, when the signal is detected at a close timing, the signal having high temporal and spatial correlation may be filtered with the circuit configuration in which the signal is considered as the alias regardless of the order of detection.

Third Embodiment

A photoelectric conversion apparatus according to a third embodiment of the present invention will now be described with reference to FIG. 13 to FIG. 15. The photoelectric conversion apparatus according to the present embodiment differs from the first embodiment in that the pixels are two-dimensionally arranged in an array pattern. A description of points common to the first embodiment is omitted and the description mainly focuses on points different from the first embodiment.

Figure 13:
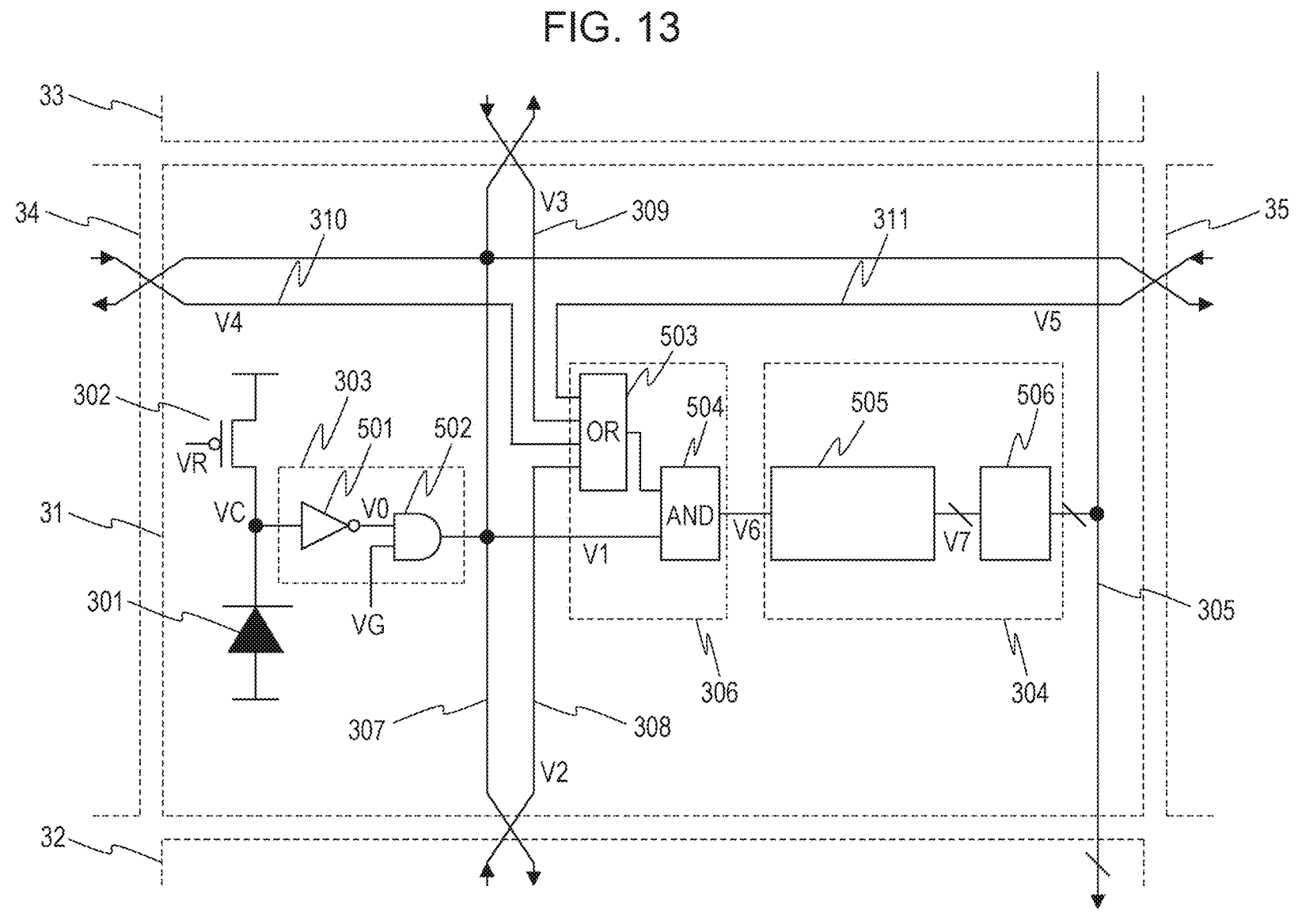

FIG. 13 illustrates an example of the circuit diagram of one pixel of the present embodiment. The first pixel 31 that is surrounded by the second pixel 32 and the third pixel 33, which are adjacent to the first pixel 31 in the up-down direction, and a fourth pixel 34 and a fifth pixel 35, which are adjacent to the first pixel 31 in the left-right direction, is exemplified for description. In other words, the first pixel 31 and the second pixel 32 are arranged in a first direction, and the second pixel 32 and the fourth pixel 34 are arranged in a second direction intersecting with the first direction. The first pixel 31 and the fifth pixel 35 are arranged in a third direction intersecting with the first direction. The first pixel 31 includes the APD 301 (the first photoelectric converter), the signal detection circuit 303 (the first detection circuit) outputting the first detection signal, and the control circuit 306 (the first control circuit). Similarly, the second pixel 32 includes the APD 301 (a second photoelectric converter), the signal detection circuit 303 (the second detection circuit) outputting the second detection signal, and the control circuit 306 (the second control circuit). The third pixel 33 includes the APD 301 (a third photoelectric converter), the signal detection circuit 303 (a third detection circuit) outputting a third detection signal, and the control circuit 306 (a third control circuit). The fourth pixel 34 includes the APD 301 (a fourth photoelectric converter), the signal detection circuit 303 (a fourth detection circuit) outputting a fourth detection signal, and the control circuit 306 (a fourth control circuit). The fifth pixel 35 includes the APD 301 (a fifth photoelectric converter), the signal detection circuit 303 (a fifth detection circuit) outputting a fifth detection signal, and the control circuit 306 (a fifth control circuit).

The control circuit 306 of the first pixel 31 controls whether the output signal from the signal detection circuit 303 of the first pixel 31 is input into the readout circuit 304 of the first pixel 31 in accordance with the output signals from the respective signal detection circuits 303 of the second to fifth pixels. The output signal from the signal detection circuit 303 of the first pixel 31 is input into the control circuits 306 of the second pixel 32, the third pixel 33, the fourth pixel 34, and the fifth pixel 35 via the control line 307.

The signal detection circuit 303 of the present embodiment includes an inverter circuit 501 performing the waveform shaping and a gate circuit 502 (a first selection circuit). The gate circuit 502 supplies the output signal from the inverter circuit 501 to the control circuit 306 during a period in which a gate signal VG input from the outside of the pixel is in the "H" level. In contrast, the gate circuit 502 does not supply the output signal from the inverter circuit 501 to the control circuit 306 during a period in which the gate signal VG is the "L" level. Inputting, for example, a pulse in the order of nanoseconds or picoseconds as the gate signal VG enables only the photon signal incident during a target period to be selectively detected.

The readout circuit 304 in the present embodiment includes a counter circuit 505 and an output circuit 506. The counter circuit 505 counts the number of input pulses to measure the incident strength of the photon detected by the first pixel 31. Although a multi-bit digital counter is exemplified as an example of the counter circuit 505, a one-bit digital counter, an analog memory using a capacitive element, or the like may be used as an example of the counter circuit 505. The counter circuit 505 is connected to the output circuit 506 with lines of a number corresponding to the number of bits of the counter circuit 505. The output circuit 506 supplies the signal output from the counter circuit 505 to the signal line 305 upon reception of a selection signal input from the outside of the pixel.

The control circuit 306 in the present embodiment includes a logic circuit 503 and a logic circuit 504. As an example of the control circuit 306, the logic circuit 503 calculates logical OR of four control lines 308, 309, 310, and 311, and the logic circuit 504 calculates logical AND of the output from the gate circuit 502 and the output from the logic circuit 503. Adopting such a circuit configuration enables the signal when the first pixel 31 and at least one of the second pixel 32, the third pixel 33, the fourth pixel 34, and the fifth pixel 35 have detected the photons at close timings to be considered as the true signal. A NOR circuit or a NAND circuit may be used for the logic circuit 503 and the logic circuit 504, instead of the OR circuit and the AND circuit, respectively. Alternatively, other combination circuits or sequential circuits may be used as the logic circuit 503 and the logic circuit 504.

Figure 14:
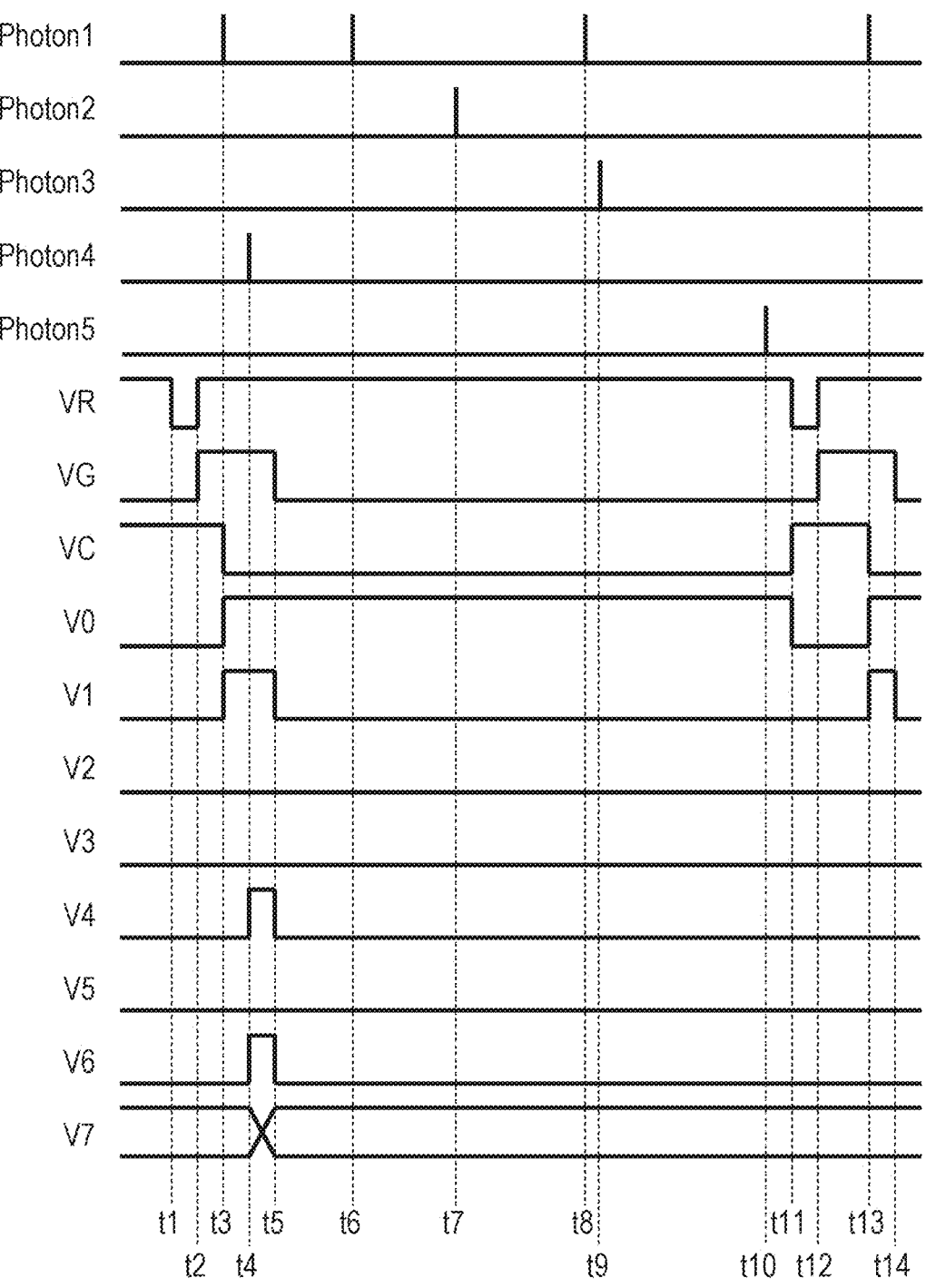
FIG. 14 is a timing chart of driving of the pixels according to the third embodiment.

FIG. 14 is a timing chart indicating the operation of the pixels in the photoelectric conversion apparatus according to the present embodiment. The potential input into the quench element in FIG. 13 is denoted by VR, the potential of an output terminal of the output from the inverter circuit 501 is denoted by V0, the potential of the output terminal of the control circuit 306 is denoted by V6, and the potential of an output terminal of the counter circuit 505 is denoted by V7. Photon 1 to Photon 5 indicate timings when the photons are input into the APDs 301 of the first to fifth pixels, respectively.

VR is set to "L" level at a time t1. A time period to a time t11 when VR is set to the "L" level again is referred to as a unit time. The potential VR is a reset signal for resetting the cathode potential VC of the APD 301 by switching the resistance value of the quench element.

VG is set to the "H" level at a time t2. During a period t2 to t5 in which VG is in the "H" level, the output signal from the inverter circuit 501 is supplied to the control circuit 306. In other words, the period in which VG is in the "H" level is a detection period of the detection signal based on the photon incident on the APD 301 and the period in which VG is in the "L" level is a non-detection period of the detection signal.

Photon 1 is incident on the APD 301 at a time t3 and the pulse wave is generated at the cathode potential VC. The output V0 from the inverter circuit 501 makes transition in accordance with the change of the cathode potential VC and V1 is in the "H" level during a period t3 to t5.

Photon 4 is incident on the APD 301 at a time t4, which is a timing close to the time t3, and V4 is in the "H" level. Since V1 and V4 are in the "H" level during a period from the time t4 to a time t5, V6 is in the "H" level to change the count value of the counter circuit 505.

Photon 1 is incident at a time t6 and a time t8, Photon 2 is incident at a time t7, Photon 3 is incident at a time t9, and Photon 5 is incident at a time t10. Since VG is in the "L" level, the output signal from the inverter circuit 501 of each pixel is not supplied to the control circuit 306.

Figure 15:
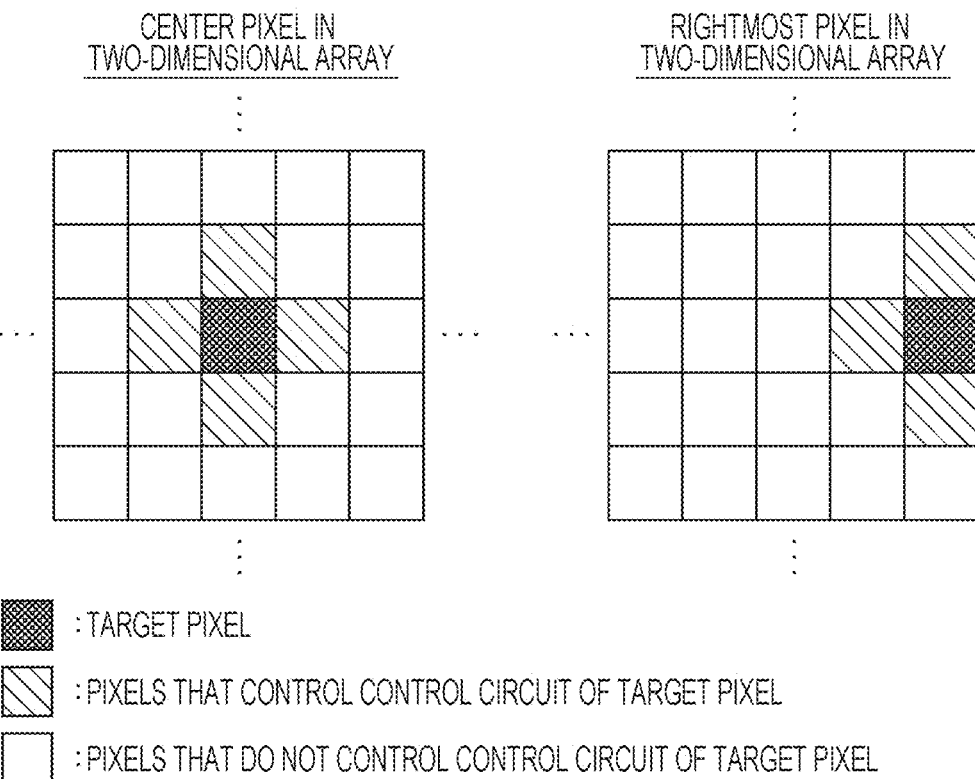
FIG. 15 is a diagram illustrating the control relationship of a pixel array according to the third embodiment.

FIG. 15 illustrates the control relationship of a pixel array in the photoelectric conversion apparatus according to the present embodiment.

When attention is given to a pixel that is arranged near the center of a two-dimensional array, the control circuit of the target pixel is controlled by the four adjacent pixels: the up and down and left and right adjacent pixels. In the present embodiment, the control circuit of the target pixel is not controlled by the pixels other than the adjacent pixels, such as pixels arranged in a diagonal direction.

When attention is given to a pixel that is arranged at the right end of the two-dimensional array, the control circuit of the target pixel is controlled only by the three adjacent pixels: the pixels arranged in the up and down direction and the pixel on the left side of the target pixel. The number of adjacent pixels of the pixels arranged on the outermost periphery of the array is smaller than that of the pixels that are not arranged on the outermost periphery of the array. Accordingly, the number of pixels controlling the control circuit of the target pixel is also decreased. When the control circuit of the target pixel is controlled by a small number of pixels, it is not possible to correctly detect the true signal or the possibility of outputting the alias is increased, compared with a case in which the target pixel is controlled using the pixels of a sufficient number. Accordingly, for example, an action is taken not to use the outermost pixels for image processing at subsequent stages.

The circuit configuration is adopted in the present embodiment, in which the signal that is detected at a timing close to the timing of any of the four adjacent pixels is considered as the true signal and the signal other than the true signal is considered as the alias. The application of the present embodiment to the two-dimensional array enables the strength of the spatial correlation of the signal with respect to the X direction and the Y direction to be determined for each pixel to improve the accuracy of suppression of the alias, compared with the case in which the one-dimensional array is used.

Modifications of Third Embodiment

A modification of the third embodiment will now be described with reference to FIG. 16A to FIG. 16D.

FIG. 16A to FIG. 16D illustrate the control relationship of a pixel array in the present modification. The configuration and the driving timing of the pixel circuit conform to those in the third embodiment. The present modification differs from the third embodiment in the arrangement of the pixels controlling the target pixel. The connection relationship of four types from Pattern 1 to Pattern 4 will be described below.

Figure 16A:
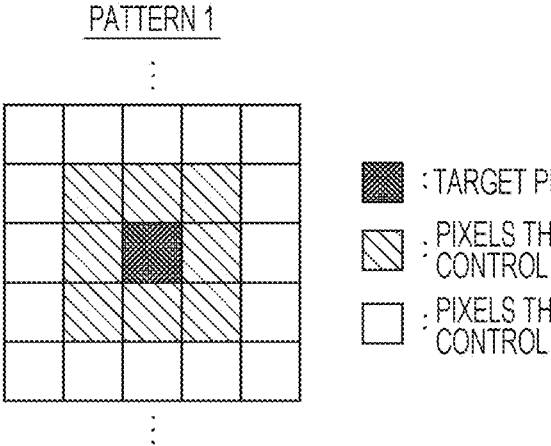
FIG. 16A is a diagram illustrating the control relationship of a pixel array according to a modification of the third embodiment.

In the connection relationship of Pattern 1 illustrated in FIG. 16A, the control circuit 306 of the target pixel is controlled by the eight pixels surrounding the target pixel. The eight pixels surrounding the target pixel are the four up and down and left and right pixels adjacent to the target pixel and the four pixels arranged in the diagonal direction of the target pixel. Since the number of pixels controlling the target pixel is greater than the those in the third embodiment, the use efficiency of the light is improved to accurately detect weaker signals.

Figure 16B:
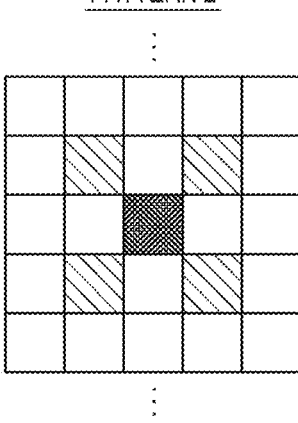
FIG. 16B is a diagram illustrating the control relationship of the pixel array according to the modification of the third embodiment.

In Pattern 2 illustrated in FIG. 16B, the control circuit 306 of the target pixel is controlled by the four pixels arranged in the diagonal direction and is not controlled by the four up and down and left and right pixels closest to the target pixel. In the pixel array using the APDs, the alias having high temporal correlation with respect to the closest pixels is easy to occur due to the crosstalk caused by the avalanche light emission. The adoption of the control relationship illustrated in FIG. 16B enables the signal having high temporal and spatial correlation to be accurately detected while suppressing the influence of the crosstalk component.

Figure 16C:
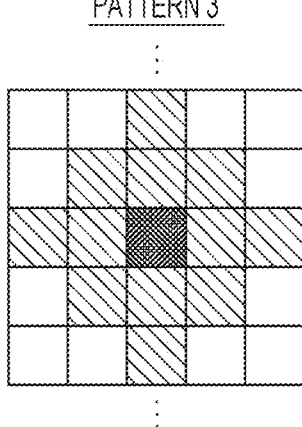
FIG. 16C is a diagram illustrating the control relationship of the pixel array according to the modification of the third embodiment.

In Pattern 3 illustrated in FIG. 16C, the control circuit 306 of the target pixel is controlled by twelve pixels including pixels that do not have direct contact with the target pixel and that include pixels apart from the target pixel by the two pixels. The adoption of such control relationship enables the signal having high temporal correlation to be accurately detected even when the spatial correlation of the signal is reduced due to blurring or motion blur caused by an optical lens.

Figure 16D:
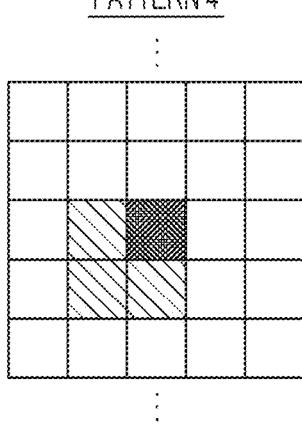
FIG. 16D is a diagram illustrating the control relationship of the pixel array according to the modification of the third embodiment.

In Pattern 4 illustrated in FIG. 16D, arrangement is adopted in which the pixels controlling the control circuit 306 of the target pixel are deviated in the X direction and the Y direction. Specifically, the control circuit 306 of the target pixel is controlled by three pixels: the pixels adjacent to the target pixel in the downward direction and the leftward direction and the pixel arranged in the lower left direction of the target pixel. The adoption of such control relationship enables the true signal and the alias to be accurately discriminated even when the signal to be detected has asymmetric spatial correlation due to the features or restrictions of an optical system or a subject. When the pattern illustrated in FIG. 16D is applied to the two-dimensional pixel array, a "pixel group controlling the target pixel" is not necessarily coincide with a "pixel group controlled by the target pixel". In other words, the number of pixels controlling the target pixel is not necessarily the same as the number of pixels controlled by the target pixel. However, the advantages of the present embodiment are achieved, as in the patterns illustrated in FIG. 15 and FIG. 16A to FIG. 16D.

Fourth Embodiment

A fourth embodiment of the present invention will now be described with reference to FIG. 17, FIG. 18A, and FIG. 18B.

Figure 17:
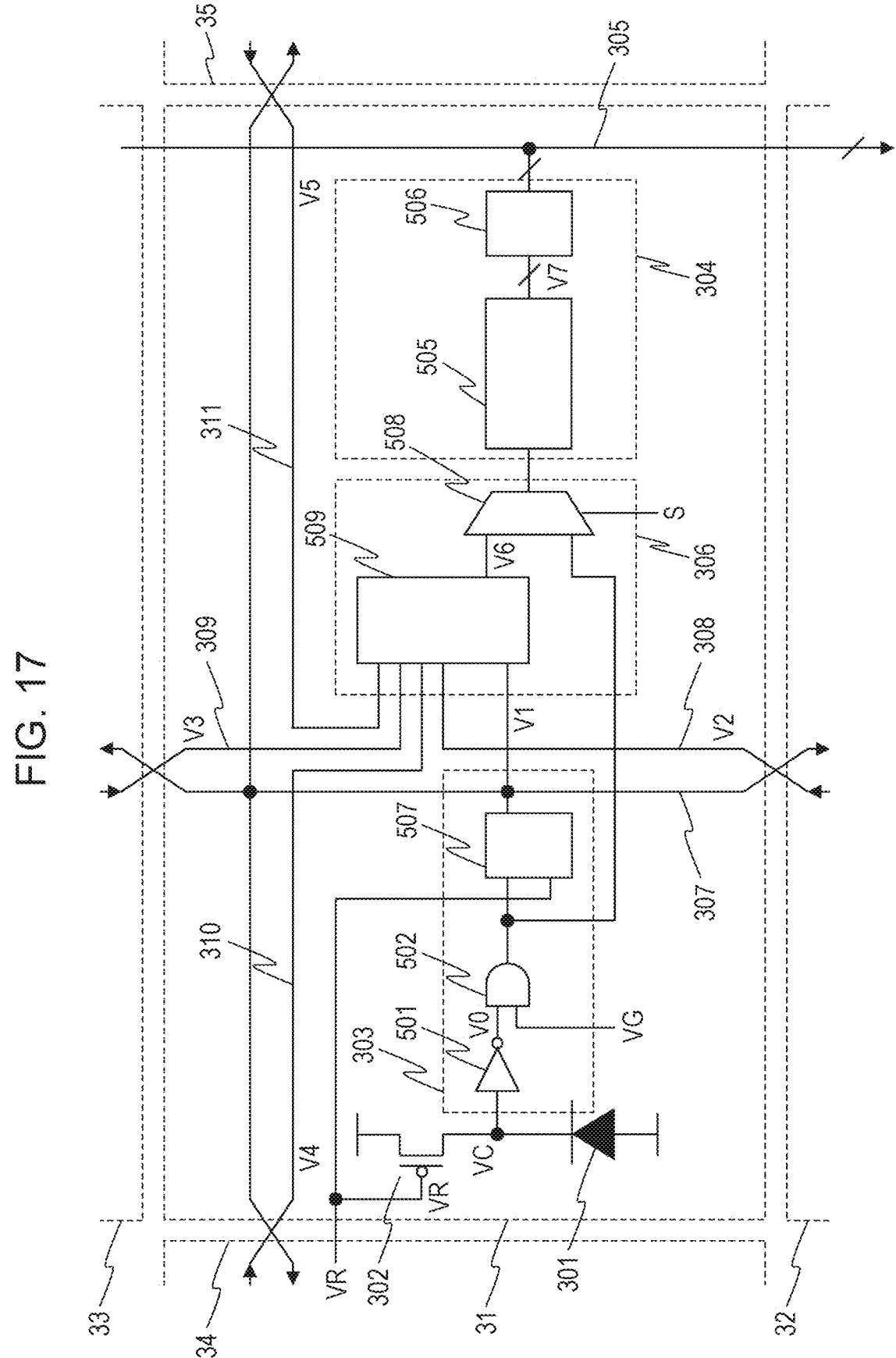
FIG. 17 is a circuit diagram of one pixel according to a fourth embodiment.

FIG. 17 illustrates an example of the circuit diagram of one pixel of the present embodiment. The present embodiment differs from the third embodiment in the circuit configuration in the control circuit 306. A description of points common to the first to third embodiments is omitted and the description mainly focuses on points different from the third embodiment.

The control circuit 306 in the present embodiment includes a multiplexer circuit 508 and a logic circuit 509.

The multiplexer circuit 508 is capable of switching between enabling and disabling of the function of the control circuit 306 in accordance with a signal S input from the outside of the pixel. When the function of the control circuit 306 is enabled, the control circuit 306 of the first pixel 31 controls whether the output from the signal detection circuit 303 of the first pixel 31 is supplied to the readout circuit 304 of the first pixel 31 in accordance with the signals from the adjacent second to fifth pixels. When the function of the control circuit 306 is disabled, the output from the signal detection circuit 303 of the first pixel 31 is directly supplied to the readout circuit 304 of the first pixel 31 regardless of the outputs from the adjacent pixels.

A circuit configuration is considered as an example of the logic circuit 509, in which logical OR of the outputs from the signal detection circuits 303 of the adjacent pixels is calculated and, then, logical AND of the output of the logical OR and the output from the signal detection circuit 303 of the first pixel 31 is calculated, as in the third embodiment. The logic circuit 509 may have a circuit configuration in which the output from the signal detection circuit 303 of the first pixel 31 is supplied to the readout circuit 304 of the first pixel 31 only when the outputs from the signal detection circuits 303 of N-number pixels or more (N is an inter greater than or equal to two), among the adjacent pixels, are in the "H" level. The logic circuit 509 may have a circuit configuration in which the "H" level is supplied to the readout circuit 304 of the first pixel 31 only when the outputs from the signal detection circuits 303 of N-number pixels or more (N is an inter greater than or equal to two), among the first pixel 31 and the pixels adjacent to the first pixel 31, are in the "H" level. In addition, a configuration is considered in which the output from the signal detection circuit 303 is weighted in accordance with the arrangement of the adjacent pixels concerning the control of the control circuit 306. For example, the logic circuit 509 may have a circuit configuration in which the output from the signal detection circuit 303 of the first pixel 31 is supplied to the readout circuit 304 of the first pixel 31 only when a weighted addition value of the signals in the "H" level exceeds a predetermined threshold value M. The threshold value M described above may be a predetermined value or may be a variable writable from the outside of the pixel.

The signal detection circuit 303 of the present embodiment includes the inverter circuit 501, the gate circuit 502, and a latch circuit 507 (a first latch circuit). The latch circuit 507 is latched to the "H" level when the photon is detected during a period in which the gate signal VG is in the "H" level. Then, when the potential VR is in the "L" level, the latch circuit 507 is also reset to the "L" level. As described above, holding the signal based on the detection of the photon in the latch circuit 507 enables the true signal and the alias to be accurately discriminated even when timing variation occurs in the circuits of the first pixel 31 and the adjacent pixels.

Figure 18A:
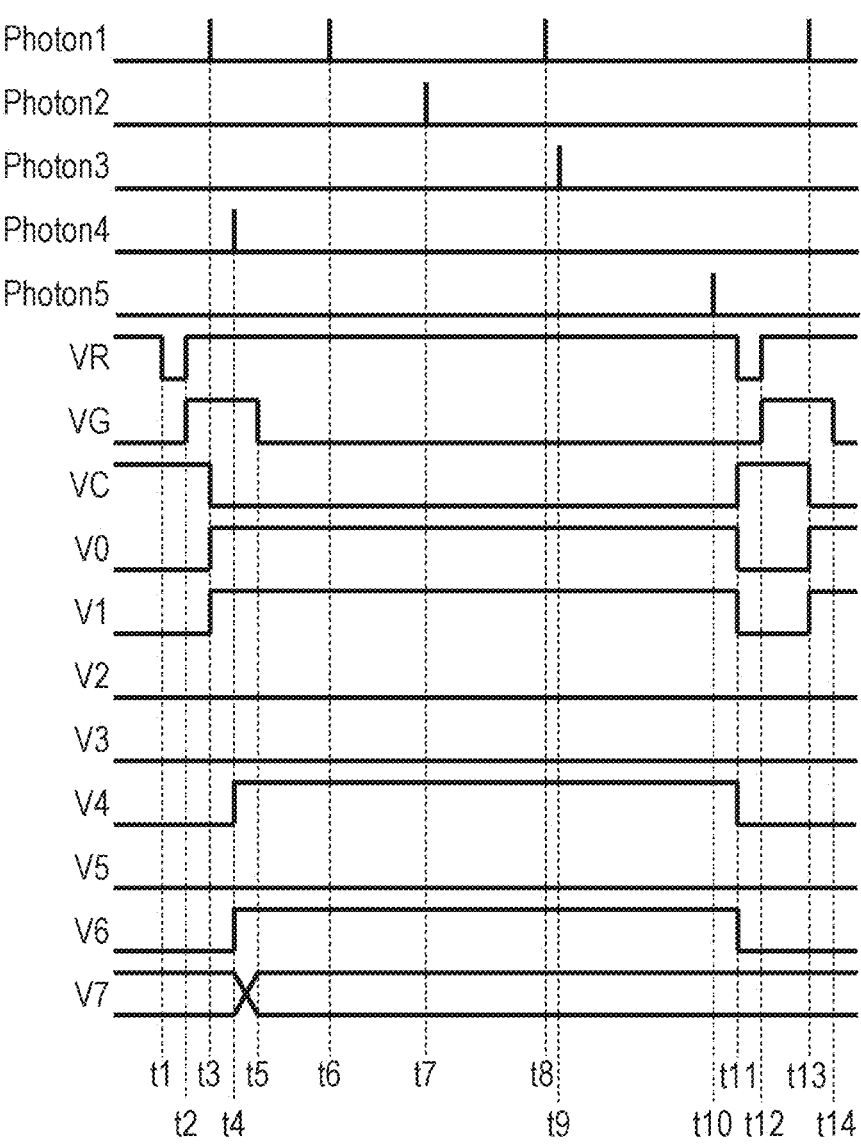
FIG. 18A is a timing chart of driving of the pixels according to the fourth embodiment.
Figure 18B:
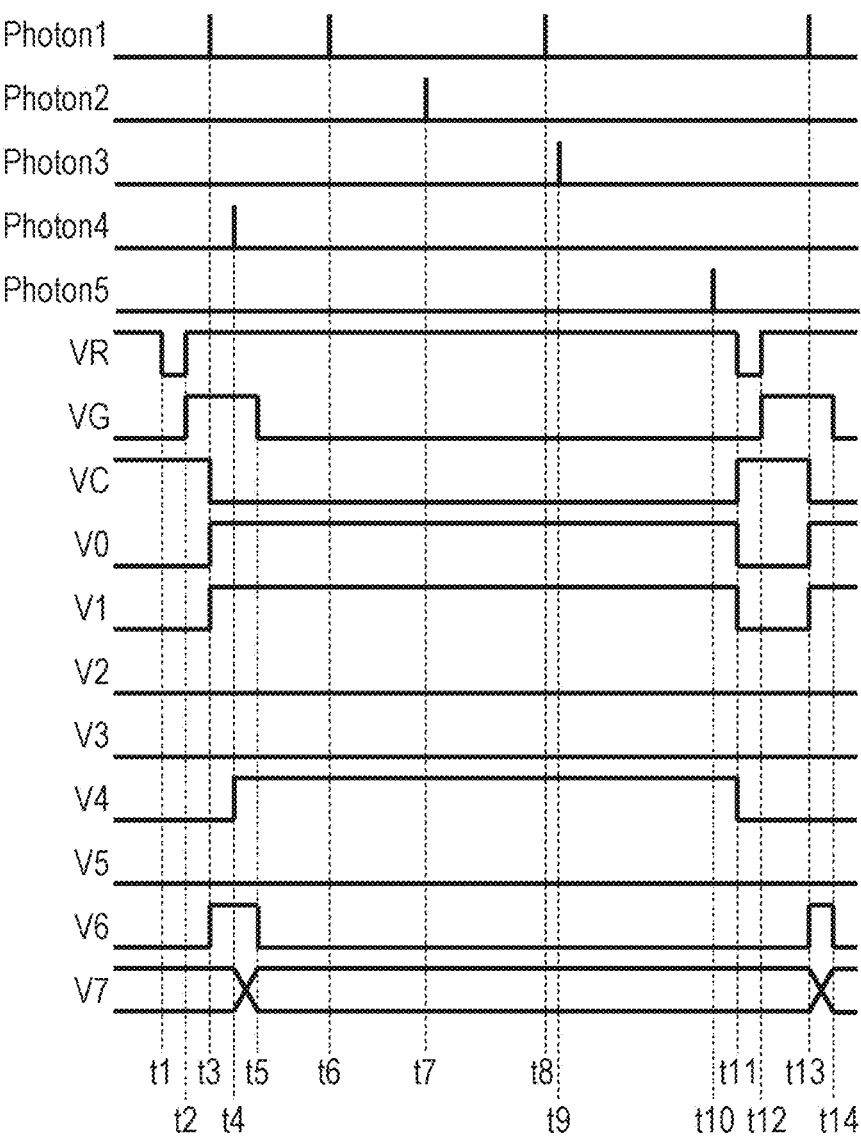
FIG. 18B is a timing chart of driving of the pixels according to the fourth embodiment.

FIG. 18A and FIG. 18B are timing charts indicating the operations of the pixels in the photoelectric conversion apparatus according to the present embodiment. A timing chart of a first drive mode in which the control circuit is enabled is illustrated in FIG. 18A. A timing chart of a second drive mode in which the control circuit is disabled is illustrated in FIG. 18B.

VR is set to the "L" level at a time t1 in FIG. 18A. A time period to a time t11 when VR is set to the "L" level again is referred to as a unit time.

VG is set to the "H" level at a time t2. During a period t2 to t5 in which VG is in the "H" level, the output signal from the inverter circuit 501 is supplied to the control circuit 306.

Photon 1 is incident on the APD 301 at a time t3 and the pulse wave is generated at the cathode potential VC. The output V0 from the inverter circuit 501 makes transition in accordance with the change of the cathode potential VC and V1 is in the "H" level during a period t3 to t5.

Photon 4 is incident on the APD 301 at a time t4, which is a timing close to the time t3, and V4 is in the "H" level. Since V1 and V4 are in the "H" level during a period from the time t4 to a time t5, V6 is in the "H" level and the photon detection pulse is supplied to V5 during a period t4 to t5.

Photon 1 is incident at a time t6 and a time t8, Photon 2 is incident at a time t7, Photon 3 is incident at a time t9, and Photon 5 is incident at a time t10. Since VG is in the "L" level, the output signal from the inverter circuit 501 is not supplied to the control circuit 306.

VR is set to the "L" level at a time t1 also in FIG. 18B, as in FIG. 18A. A time period to a time t11 when VR is set to the "L" level again is referred to as a unit time.

VG is set to the "H" level at a time t2. During a period t2 to t5 in which VG is in the "H" level, the output signal from the inverter circuit 501 is supplied to the control circuit 306.

Photon 1 is incident on the APD 301 at a time t3 and the pulse wave is generated at the cathode potential VC. When the output V0 from the inverter circuit 501 makes transition in accordance with the change of the cathode potential VC and V1 is in the "H" level, V6 is also in the "H" level and the photon detection pulse is supplied to V5 during a period t3 to t5.

Although Photon 1 is incident at a time t6 and a time t8, Photon 4 is incident at t4, Photon 2 is incident at a time t7, Photon 3 is incident at a time t9, and Photon 5 is incident at a time t10, these signals do not contribute to the change of V6. Since VG is in the "L" level, the output signal from the inverter circuit 501 is not supplied to the control circuit 306.

The configuration is described in the second embodiment in which, when the adjacent pixels have detected the signals at close timings, the signal that has been first detected is considered as the true signal and the signal that has been subsequently detected is considered as the alias to filter the signal caused by the crosstalk component. In contrast, in the present embodiment, when the adjacent pixels have detected the signals at close timings, the signal that has been first detected may be considered as the alias and the signal that has been subsequently detected may be considered as the true signal to filter the signal caused by an ambient light component.

In the present embodiment, it is possible to switch between the drive mode in which the true signal and the alias are discriminated based on the strength of the temporal and spatial correlation and the drive mode in which the signal is output regardless of the strength of the temporal and spatial correlation. Selecting an optimal drive mode in accordance with the scene enables the signal quality in image capturing to be improved.

Fifth Embodiment

A photoelectric conversion apparatus according to a fifth embodiment will now be described with reference to FIG. 19A to FIG. 19C. FIG. 19A to FIG. 19C illustrate the control relationship of a pixel array in the photoelectric conversion apparatus according to the present embodiment. The pixels having different connection relationships with the pixels concerning the control of the control circuit are mixed in the photoelectric conversion apparatus according to the present embodiment.

As illustrated in FIG. 19A, pixels A and pixels B are arranged in a two-dimensional array. The pixels A have connection relationship with the pixels concerning the control of the control circuit, which is different from that of the pixels B. Pixel rows in which the pixels A are lined and pixel rows in which the pixels B are lined are alternately arranged for every row in FIG. 19A.

FIG. 19B illustrates the control relationship of the pixel A and FIG. 19C illustrates the control relationship of the pixel B. The control circuit of the pixel A is controlled by the two left and right pixels adjacent to the target pixel. In contrast, the control circuit of the pixel B is controlled by the pixels of one row in which the target pixel is arranged. In the arrangement illustrated in FIG. 19A in which the pixel rows in which the pixels A are lined and the pixel rows in which the pixels B are lined are alternately arranged for every row, the pixels A are connected to each other and the pixels B are connected to each other.

Since the pixels A have a different number of pixels concerning the control and different arrangement positions from those of the pixels B, the strength of the spatial correlation of the detected signals of the pixels A is different from that of the pixels B. With such a photoelectric conversion apparatus, since the signals having high spatial correlation and the signals having low spatial correlation are capable of simultaneously acquired, it is possible to achieve the effect of improving the accuracy of discrimination of the true signal and the alias.

Modifications of Fifth Embodiment

A modification of the fifth embodiment will now be described with reference to FIG. 20A to FIG. 20C.

FIG. 20A to FIG. 20C illustrate the control relationship of a pixel array in the present modification. Although the mixing of the pixels having different connection relationships with the pixels concerning the control of the control circuit is common to the fifth embodiment, the present modification differs from the fifth embodiment in that the pixels having different connection relationships are connected to each other.

As illustrated in FIG. 20A, the pixels A and the pixels B are arranged in a two-dimensional array. The pixels A have connection relationship with the pixels concerning the control of the control circuit, which is different from that of the pixels B. The pixels A and the pixels B are alternately arranged in FIG. 20A.

FIG. 20B illustrates the control relationship of the pixel A and FIG. 20C illustrates the control relationship of the pixel B. The control circuit of the pixel A is controlled by the four up and down and left and right pixels adjacent to the target pixel. In contrast, the control circuit of the pixel B is controlled by eight pixels including the four pixels diagonally arranged with respect to the target pixel and the four pixels apart from the target pixel by the two pixels. In the arrangement illustrated in FIG. 20A in which the pixels A and the pixels B are alternately arranged, the pixels A are connected to the pixels B for the control of the control circuits.

Since the pixels A have a different number of pixels concerning the control and different arrangement positions from those of the pixels B, the strength of the spatial correlation of the detected signals of the pixels A is different from that of the pixels B. With such a photoelectric conversion apparatus, since the signals having high spatial correlation and the signals having low spatial correlation are capable of simultaneously acquired, it is possible to achieve the effect of improving the accuracy of discrimination of the true signal and the alias.

Sixth Embodiment

A photoelectric conversion system according to the present embodiment will now be described with reference to FIG. 21. FIG. 21 is a block diagram schematically illustrating the configuration of the photoelectric conversion system according to the present embodiment.

The photoelectric conversion apparatuses described in the above first to fifth embodiments are applicable to various photoelectric conversion systems. For example, a digital still camera, a digital camcorder, a monitoring camera, a copier, a facsimile, a mobile phone, an on-vehicle camera, and an observation satellite are exemplified as examples of the photoelectric conversion systems to which the photoelectric conversion apparatuses described in the above first to sixth embodiments are applicable. In addition, a camera module including an optical system, such as a lens, and an imaging apparatus is also included in the photoelectric conversion system. A block diagram of the digital still camera is illustrated in FIG. 21 as an example of the above systems.

The photoelectric conversion system illustrated in FIG. 21 includes an imaging apparatus 1004, which is an example of the photoelectric conversion apparatus, and a lens 1002 that forms an optical image of a subject on the imaging apparatus 1004. In addition, the photoelectric conversion system illustrated in FIG. 21 includes an aperture stop 1003 for varying the amount of light passing through the lens 1002 and a barrier 1001 for protecting the lens 1002. The lens 1002 and the aperture stop 1003 are the optical system to condense light into the imaging apparatus 1004. The imaging apparatus 1004 is the photoelectric conversion apparatus of any of the above embodiments and converts the optical image formed by the lens 1002 into an electric signal.

The photoelectric conversion system also includes a signal processing unit 1007, which is an image generator that processes an output signal output from the imaging apparatus 1004 to generate an image. The signal processing unit 1007 performs an operation to output image data through a variety of correction and compression, if needed. The signal processing unit 1007 may be formed on a semiconductor substrate on which the imaging apparatus 1004 is provided or may be formed on a semiconductor substrate different from that of the imaging apparatus 1004.

The photoelectric conversion system further includes a memory unit 1010 for temporarily storing the image data and an external interface unit (external I/F unit) 1013 for communication with an external computer and so on. The photoelectric conversion system further includes a recording medium 1012, such as a semiconductor memory, for performing recording or readout of imaging data and a recording medium control interface unit (recording medium control I/F unit) 1011 for performing the recording onto or the readout from the recording medium 1012. The recording medium 1012 may be incorporated in the photoelectric conversion system or may be detachable.

The photoelectric conversion system further includes an overall control-calculation unit 1009 that controls various arithmetic operations and the entire digital still camera and a timing generation unit 1008 that supplies various timing signals to the imaging apparatus 1004 and the signal processing unit 1007. The timing signals and the likes may be externally input. It is sufficient for the photoelectric conversion system to include at least the imaging apparatus 1004 and the signal processing unit 1007, which processes the output signal output from the imaging apparatus 1004.

The imaging apparatus 1004 supplies an imaging signal to the signal processing unit 1007. The signal processing unit 1007 performs certain signal processing to the imaging signal output from the imaging apparatus 1004 to output the image data. The signal processing unit 1007 generates an image using the imaging signal.

As described above, according to the present embodiment, it is possible to realize the photoelectric conversion system to which the photoelectric conversion apparatus (the imaging apparatus) of any of the above embodiments is applied.

Seventh Embodiment

Figure 22A:
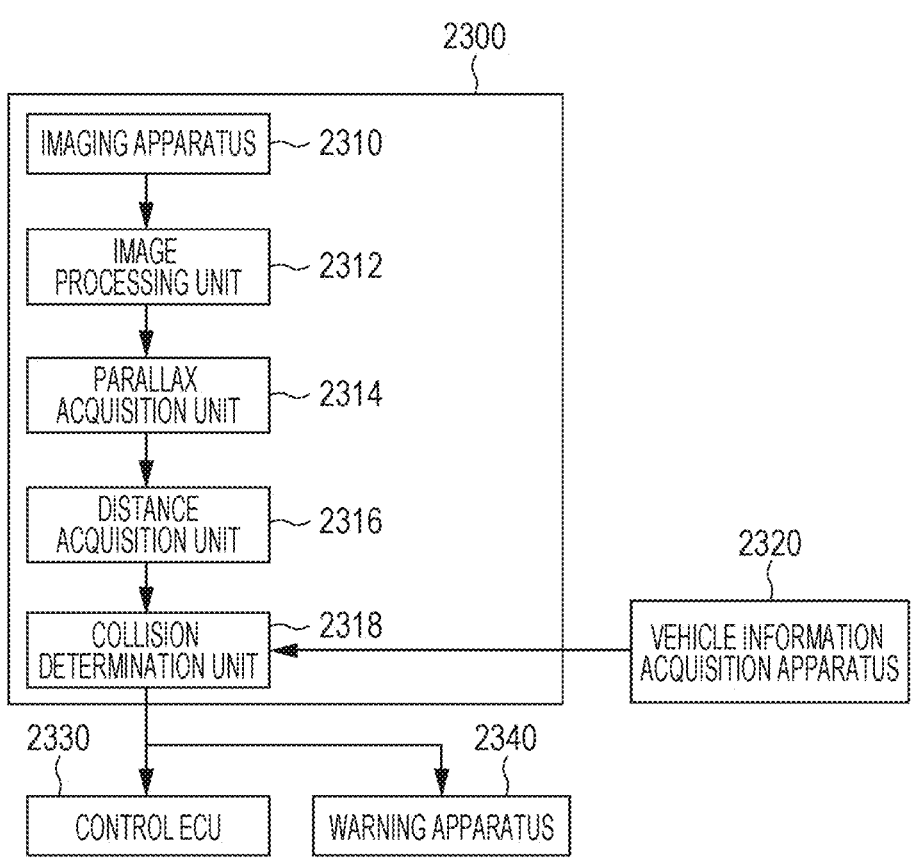
FIG. 22A is a functional block diagram of a photoelectric conversion system according to a seventh embodiment.
Figure 22B:
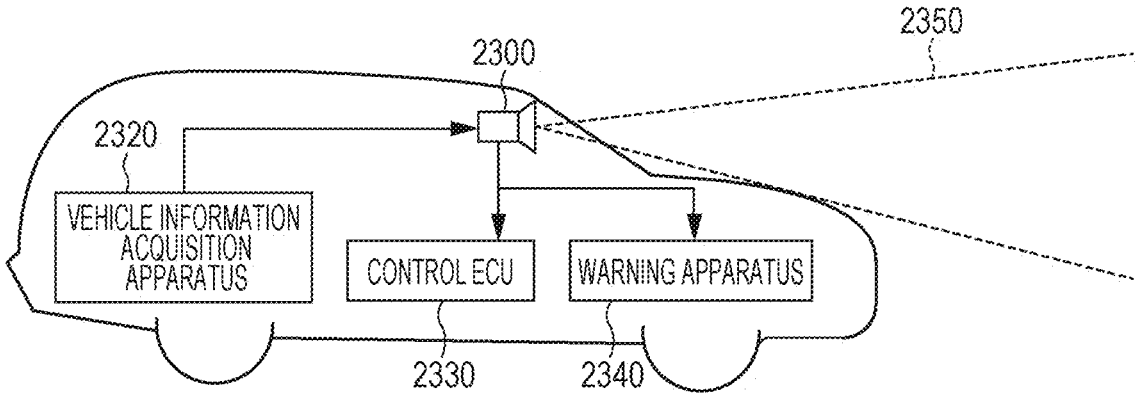
FIG. 22B is a functional block diagram of the photoelectric conversion system according to the seventh embodiment.

A photoelectric conversion system and a movable body of the present embodiment will now be described with reference to FIG. 22A and FIG. 22B. FIG. 22A and FIG. 22B are diagrams illustrating the configurations of the photoelectric conversion system and the movable body, respectively, of the present embodiment.

FIG. 22A illustrates an example of the photoelectric conversion system concerning an on-vehicle camera. A photoelectric conversion system 2300 includes an imaging apparatus 2310. The imaging apparatus 2310 is the photoelectric conversion apparatus described in any of the above embodiments. The photoelectric conversion system 2300 includes an image processing unit 2312 that performs image processing to multiple pieces of image data acquired by the imaging apparatus 2310, and a parallax acquisition unit 2314 that calculates a parallax (a phase difference of a parallax image) from the multiple pieces of image data acquired by the photoelectric conversion system 2300. In addition, the photoelectric conversion system 2300 includes a distance acquisition unit 2316 that calculates the distance to a target object based on the calculated parallax and a collision determination unit 2318 that determines whether the possibility of collision lies based on the calculated distance. Here, the parallax acquisition unit 2314 and the distance acquisition unit 2316 are examples of distance information acquiring means for acquiring the distance to the target object. In other words, the distance information is information concerning the parallax, the amount of defocusing, the distance to the target object, and so on. The collision determination unit 2318 may determine the possibility of collision using any distance information. The distance information acquiring means may be realized by hardware that is dedicatedly designed or may be realized by a software module.

Alternatively, the distance information acquisition unit may be realized by a field programmable gate array (FPGA), an application specific integrated circuit (ASIC), or the like or may be realized by any combination of these.

The photoelectric conversion system 2300 is connected to a vehicle information acquisition apparatus 2320 and is capable of acquiring vehicle information, such as a vehicle speed, a yaw rate, and a rudder angle. In addition, the photoelectric conversion system 2300 is connected to a control electronic control unit (ECU) 2330, which is a control unit that outputs a control signal causing a vehicle to generate braking force. Furthermore, the photoelectric conversion system 2300 is connected to a warning apparatus 2340 that issues a warning to a driver based on the result of determination in the collision determination unit 2318. For example, when the possibility of collision is high as the result of determination in the collision determination unit 2318, the control ECU 2330 performs vehicle control to avoid collision and/or reduce damage by, for example, braking, easing the accelerator, or suppressing engine output. The warning apparatus 2340 issues a warning to a user by, for example, giving a warning, such as sound, displaying warning information on a screen of a car navigation system or the like, imparting motion to a seat belt or a steering.

In the present embodiment, an image of the circumference of the vehicle, for example, the front side or the rear side of the vehicle is captured by the photoelectric conversion system 2300. FIG. 22B illustrates the photoelectric conversion system when an image of the front of the vehicle is captured (an imaging range 2350). The vehicle information acquisition apparatus 2320 issues an instruction to the photoelectric conversion system 2300 or the imaging apparatus 2310. With such a configuration, it is possible to further improve the accuracy of the ranging.

Although the example of the control to avoid the collision with another vehicle is described above, the photoelectric conversion system is applicable to control of an automatic operation while following another vehicle, control of the automatic operation so as to stay in its lane, and so on. In addition, the photoelectric conversion system is not limited to the vehicle, such as a host vehicle, and is applicable to a movable body (a movable system), such as a ship or a vessel, an aircraft, or an industrial robot. Furthermore, the photoelectric conversion system is not limited to movable body and is applicable to a device, such as an intelligent transport system (ITS), which widely uses object recognition.

Eighth Embodiment

Figure 23:
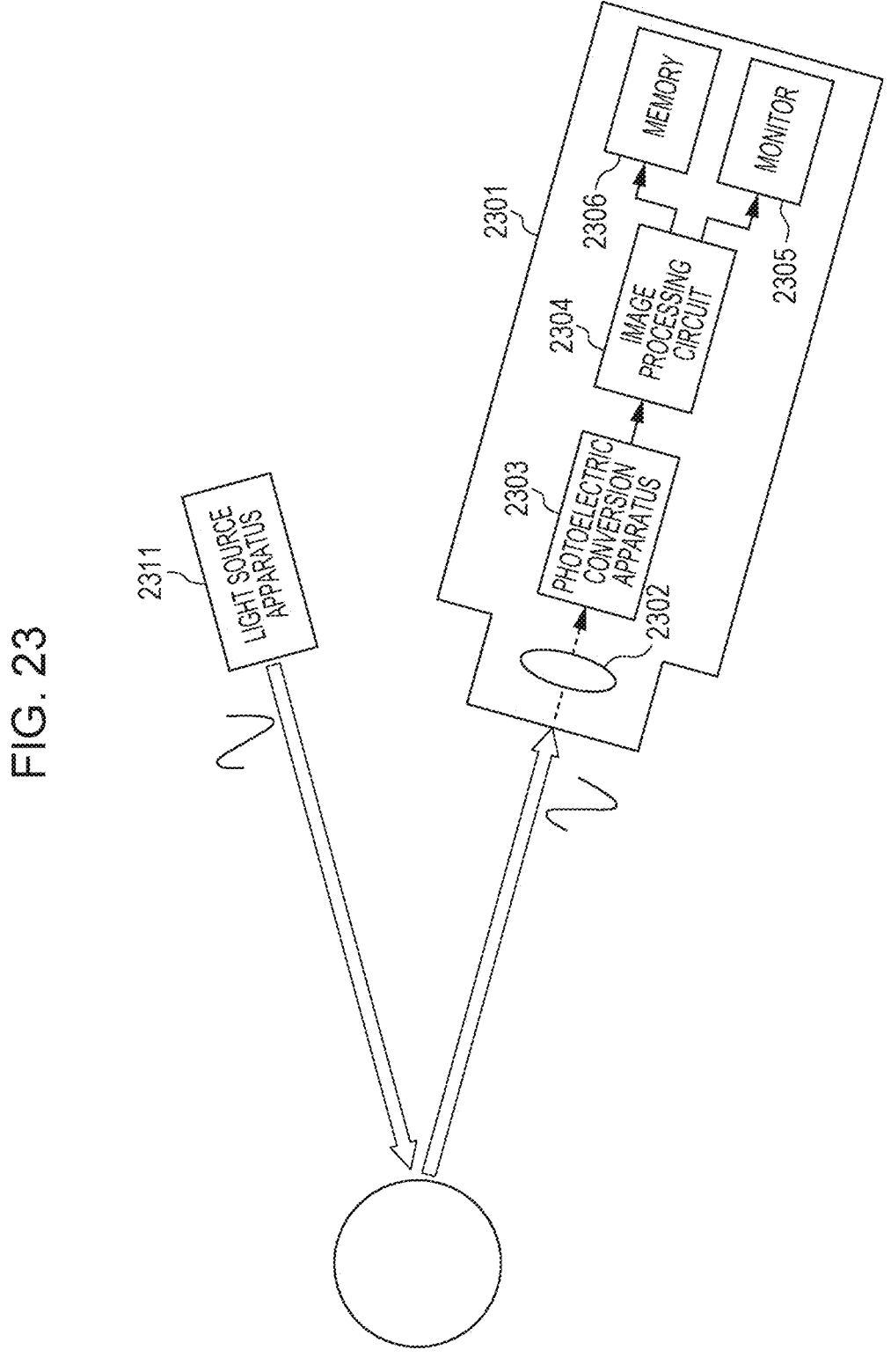
FIG. 23 is a functional block diagram of a photoelectric conversion system according to an eighth embodiment.

A photoelectric conversion system of the present embodiment will now be described with reference to FIG. 23. FIG. 23 is a block diagram illustrating an example of the configuration of a distance image sensor, which is the photoelectric conversion system of the present embodiment.

As illustrated in FIG. 23, a distance image sensor 2301 includes an optical system 2302, a photoelectric conversion apparatus 2303, an image processing circuit 2304, a monitor 2305, and a memory 2306. The distance image sensor 2301 is capable of receiving light (modulated light or pulsed light) that is flooded from a light source apparatus 2311 to a subject and that is reflected from the surface of the subject to acquire a distance image in accordance with the distance to the subject.

The optical system 2302 is composed of one lens or multiple lenses. The optical system 2302 leads image light (incident light) from the subject to the photoelectric conversion apparatus 2303 to from an image on a light receiving surface (a sensor portion) of the photoelectric conversion apparatus 2303.

The photoelectric conversion apparatus of each embodiment described above is applied as the photoelectric conversion apparatus 2303. A distance signal indicating the distance calculated from a light receiving signal output from the photoelectric conversion apparatus 2303 is supplied to the image processing circuit 2304.

The image processing circuit 2304 performs the image processing to build the distance image based on the distance signal supplied from the photoelectric conversion apparatus 2303. The distance image (image data) acquired through the image processing is supplied to the monitor 2305 for display and/or is supplied to the memory 2306 for storage (recording).

With the distance image sensor 2301 configured in the above manner, it is possible to acquire, for example, the more accurate distance image with improvement of the features of the pixels by applying the photoelectric conversion apparatus described above.

Ninth Embodiment

Figure 24:
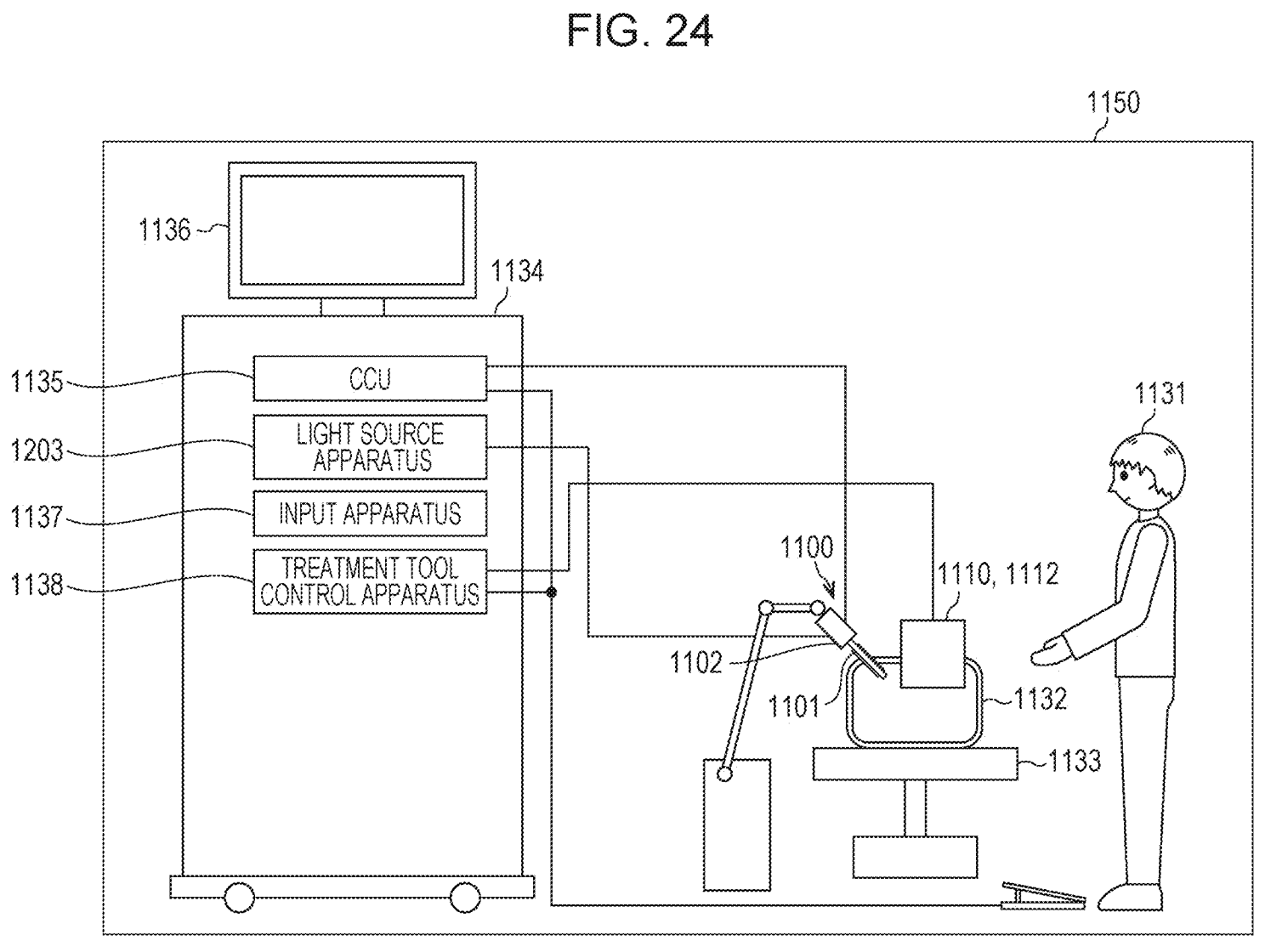

A photoelectric conversion system of the present embodiment will now be described with reference to FIG. 24. FIG. 24 is a diagram illustrating an example of a schematic configuration of an endoscopic surgery system, which is the photoelectric conversion system of the present embodiment.

A state is illustrated in FIG. 24, in which an operator (doctor) 1131 is doing surgery to a patient 1132 on a patient bet 1133 using an endoscopic surgery system 1150. As illustrated in FIG. 24, the endoscopic surgery system 1150 is composed of an endoscope 1100, a surgical tool 1110, and a cart 1134 on which various devices for the endoscopic surgery are mounted.

The endoscope 1100 is composed of a lens tube 1101 and a camera head 1102 connected to the base end of the lens tube 1101. An area of a predetermined length from the tip of the lens tube 1101 is inserted into the body cavity of the patient 1132. Although the endoscope 1100 composed as a so-called hard mirror having the hard lens tube 1101 is illustrated in the example in FIG. 24, the endoscope 1100 may be composed as a so-called soft mirror having the soft lens tube.

An opening having a set-in objective lens is provided at the tip of the lens tube 1101. A light source apparatus 1203 is connected to the endoscope 1100. Light generated by the light source apparatus 1203 is led to the tip of the lens tube by a light guide extending in the lens tube 1101 and is radiated to an observation target in the body cavity of the patient 1132 via the objective lens. The endoscope 1100 may be a forward-viewing endoscope or may be a forward-oblique-viewing endoscope or a side-viewing endoscope.

An optical system and a photoelectric conversion apparatus are provided in the camera head 1102, and reflected light (observed light) from the observation target is condensed to the photoelectric conversion apparatus by the optical system. The observed light is subjected to the photoelectric conversion by the photoelectric conversion apparatus to generate an electric signal corresponding to the observed light, that is, an image signal corresponding to an observed image. The photoelectric conversion apparatus described above in each embodiment is capable of being used as the photoelectric conversion apparatus here. The image signal is transmitted to a camera control unit (CCU) 1135 as raw data.

The CCU 1135 is composed of a central processing unit (CPU), a graphics processing unit (GPU), or the like and controls the operations of the endoscope 1100 and a display apparatus 1136 in a centralized manner. In addition, the CCU 1135 receives the image signal from the camera head 1102 to perform a variety of image processing, such as development (mosaic processing), for displaying an image based on the image signal to the image signal.

The display apparatus 1136 displays an image based on the image signal subjected to the image processing in the CCU 1135 under the control of the CCU 1135.

The light source apparatus 1203 is composed of a light source, such as a light emitting diode (LED), and supplies irradiation light in shooting of a surgical field or the like to the endoscope 1100.

An input apparatus 1137 is an input interface for the endoscopic surgery system 1150. The user is capable of inputting a variety of information and various instructions into the endoscopic surgery system 1150 with the input apparatus 1137.

A treatment tool control apparatus 1138 controls driving of an energy treatment tool 1112 for cauterization of tissue, dissection, sealing of blood vessel, and so on.

The light source apparatus 1203, which supplies the irradiation light in shooting of the surgical field to the endoscope 1100, may be composed of a white light source composed of, for example, the LED, a laser light source, or a combination of these. Since the output strength and the output timing of each color (each wavelength) are capable of being controlled with high accuracy when the white light source is composed of a combination of RGB laser light sources, it is possible to perform adjustment of white balance of a shot image in the light source apparatus 1203. In addition, in this case, the image corresponding to each of RGB is capable of being captured in time division by radiating the laser light from each of the RGB laser light sources to the observation target in time division and controlling driving of an imaging element of the camera head 1102 in synchronization with the radiation timing. With this method, it is possible to acquire a color image without providing a color filter in the imaging element.

In addition, driving of the light source apparatus 1203 may be controlled so that the intensity of the light to be output is changed for every predetermined time. It is possible to generate an image of a high dynamic range without so-called under exposure and over exposure by controlling the driving of the imaging element of the camera head 1102 in synchronization with the timing of change of the intensity of the light to acquire the images in time division and combining the images.

Furthermore, the light source apparatus 1203 may be configured so as to be capable of supplying the light of a predetermined wavelength band corresponding to special-light observation. In the special-light observation, for example, the wavelength dependence of absorption of light in the tissue of the body is used. Specifically, the light of a band narrower than that of the irradiation light (that is, white light) in normal observation is radiated to shoot certain tissue, such as a blood vessel of a superficial portion of a mucous membrane, with high contrast. Alternatively, in the special-light observation, fluorescence observation may be performed in which an image is acquired with fluorescence occurring in response to radiation of excitation light. Radiating the excitation light to tissue of the body to observe the fluorescence from the tissue of the body, locally injecting reagent, such as indocyanine green (ICG), into tissue of the body and radiating the excitation light corresponding to the wavelength of the fluorescence of the reagent to the tissue of the body to generate a fluorescent image, or the like is capable of being performed in the fluorescence observation. The light source apparatus 1203 may be configured so as to be capable of supplying the narrow-band light and/or the excitation light corresponding to the special-light observation.

Tenth Embodiment

Figure 25A:
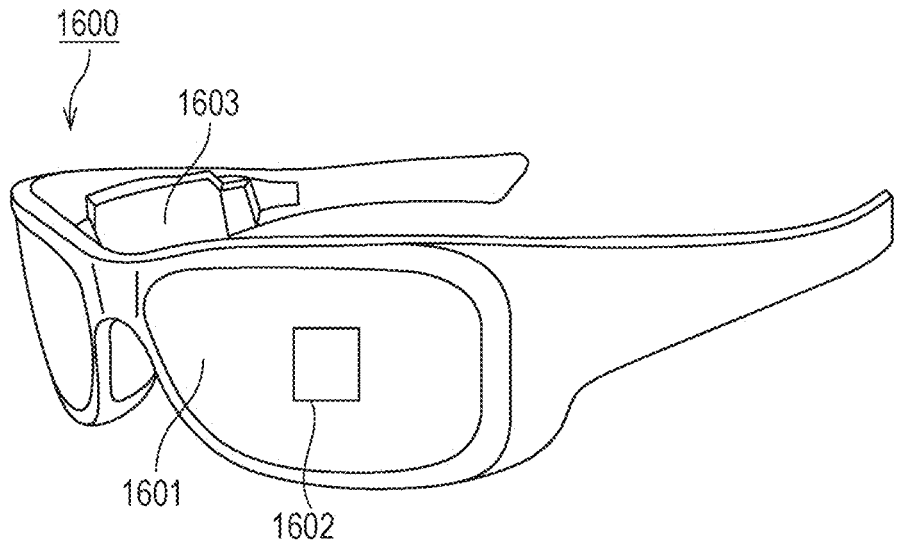
FIG. 25A is a functional block diagram of a photoelectric conversion system according to a tenth embodiment.

A photoelectric conversion system of the present embodiment will now be described with reference to FIG. 25A and FIG. 25B. FIG. 25A is used to describe eyeglasses 1600 (smart glasses), which are the photoelectric conversion system of the present embodiment. The eyeglasses 1600 include a photoelectric conversion apparatus 1602. The photoelectric conversion apparatus 1602 is the photoelectric conversion apparatus described above in each embodiment. A display apparatus including a light emitting unit, such as an organic LED (OLED) or an LED, may be provided at the rear face side of a lens 1601. One photoelectric conversion apparatus 1602 may be provided or multiple photoelectric conversion apparatuses 1602 may be provided. Alternatively, the photoelectric conversion apparatuses of multiple kinds may be combined for usage. The arrangement position of the photoelectric conversion apparatus 1602 is not limited to the one in FIG. 25A.

The eyeglasses 1600 further include a control apparatus 1603. The control apparatus 1603 functions as a power supply that supplies electric power to the photoelectric conversion apparatus 1602 and the display apparatus described above. In addition, the control apparatus 1603 controls the operations of the photoelectric conversion apparatus 1602 and the display apparatus. An optical system to condense light to the photoelectric conversion apparatus 1602 is formed in the lens 1601.

Figure 25B:
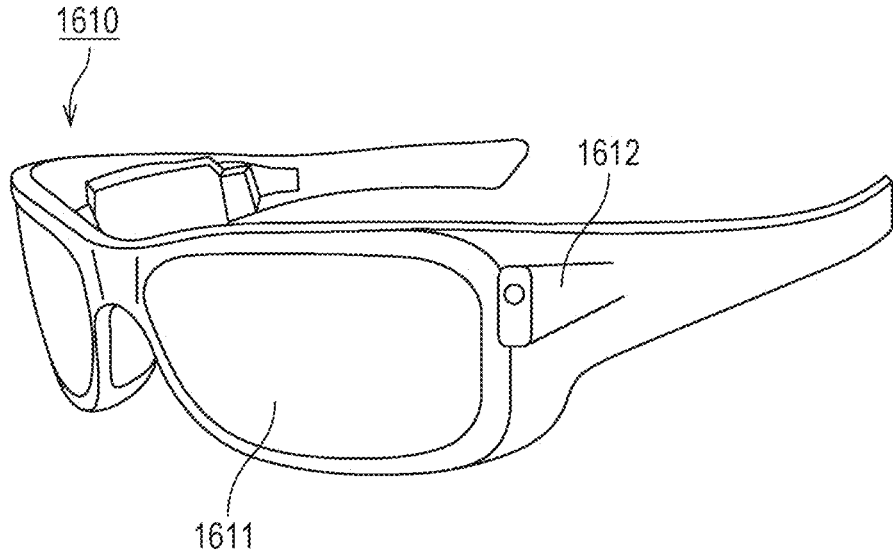
FIG. 25B is a functional block diagram of the photoelectric conversion system according to the tenth embodiment.

FIG. 25B is used to describe eyeglasses 1610 (smart glasses) according to one example of application. The eyeglasses 1610 include a control apparatus 1612. A photoelectric conversion apparatus corresponding to the photoelectric conversion apparatus 1602 and a display apparatus are mounted in the control apparatus 1612. An optical system to project light emitted from the photoelectric conversion apparatus and the display apparatus in the control apparatus 1612 is formed in a lens 1611 and an image is projected on the lens 1611. The control apparatus 1612 functions as a power supply to supply electric power to the photoelectric conversion apparatus and the display apparatus and controls the operations of the photoelectric conversion apparatus and the display apparatus. The control apparatus may include a line-of-sight detector that detects the line of sight of a wearer. Infrared radiation may be used for the detection of the line of sight. An infrared light emitter emits the infrared light to the eye of the user who gazes on a displayed image. Reflected light of the emitted infrared light from the eye is detected by an imager including a light-receiving element to acquire the shot image of the eye. Reducing means for reducing the light from the infrared light emitter to the display unit in a plan view is provided to reduce decrease in the image quality.

The line of sight of the user to the displayed image is detected from the shot image of the eye acquired through the shooting with the infrared light. An arbitrary known method is applicable for the detection of the line of sight using the shot image of the eye. For example, a line-of-sight detecting method based on a Purkinje image generated by reflection of the irradiation light from the cornea may be used.

More specifically, the line-of-sight detection based on a pupil-cornea reflection method is performed. A light-of-sight vector representing the orientation of the eye (rotation angle) is calculated based on the image of the pupil included in the shot image of the eye and the Purkinje image using the pupil-cornea reflection method to detect the line of sight of the user.

The display apparatus of the present embodiment may include the photoelectric conversion apparatus including the light-receiving element and may control the image displayed in the display apparatus based on line-of-sight information about the user from the photoelectric conversion apparatus.

Specifically, the display apparatus determines a first field-of-view area on which the user gazes and a second field-of-view area other than the first field-of-view area based on the line-of-sight information. The first field-of-view area and the second field-of-view area may be determined by a controller of the display apparatus or may be received from an external controller that determines the first field-of-view area and the second field-of-view area. In a display area of the display apparatus, the display resolution of the first field-of-view area may be controlled so as to be higher than the display resolution of the second field-of-view area. In other words, the resolution of the second field-of-view area may be made lower than that of the first field-of-view area.

The display area includes a first display area and a second display area different from the first display area. An area having higher priority may be determined from the first display area and the second display area based on the line-of-sight information. The first field-of-view area and the second field-of-view area may be determined by the controller of the display apparatus or may be received from an external controller that determines the first field-of-view area and the second field-of-view area. The resolution of the area having higher priority may be controlled so as to be higher than the resolution of the area other than the area having higher priority. In other words, the resolution of the area having relatively low priority may be made low.

Artificial intelligence (AI) may be used for the determination of the first field-of-view area and the area having higher priority. The AI may be a model in which the angle of the line of sight and the distance to a target object ahead of the line of sight are estimated from the image of the eye using the image of the eye and the direction to which the eye in the image actually directed as teacher data. An AI program may be held in the display apparatus, the photoelectric conversion apparatus, or an external apparatus. When an external apparatus holds the AI program, the AI program is transferred to the display apparatus via communication.

In display control based on visual contact detection, smart glasses further including a photoelectric conversion apparatus that captures outside image are preferably applied. The smart glasses are capable of displaying external information that is captured in real time.

Modifications of Embodiments

The present invention is not limited to the above embodiments and may be modified in various manners.

For example, an example in which the configuration of part of any of the embodiments is added to another embodiment and an example in which the configuration of part of any of the embodiments is replaced with the configuration of part of another embodiment are also included in the embodiments of the present invention.

The photoelectric conversion systems described above in the sixth embodiment and the seventh embodiment are examples of the photoelectric conversion system to which the photoelectric conversion apparatus is applicable, and the photoelectric conversion systems to which the photoelectric conversion apparatuses of the present invention are applicable are not limited to the configurations illustrated in FIG. 21, FIG. 22A, and FIG. 22B. The same applies to the ToF system described in the eighth embodiment, the endoscope described in the ninth embodiment, and the smart glasses described in the tenth embodiment.

The above embodiments are only examples of embodiment in implementation of the present invention and the technical scope of the present invention should not be limitedly interpreted by the above embodiments. In other words, the present invention is capable of being implemented in various modes without departing from the technical idea of the present invention or the major features thereof.

The present invention is not limited to the above embodiments and may be changed and modified in various manners without departing from the sprit and range of the present invention. Accordingly, the following claims are appended to open the range of the present invention.

According to the present invention, it is possible to achieve both high spatial resolution and suppression of aliasing.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A photoelectric conversion apparatus comprising:
   a pixel region including a plurality of pixels arranged in an array pattern,
   wherein the plurality of pixels includes a first pixel, a second pixel, and a third pixel,
   wherein the first pixel includes
   a first photoelectric converter,
   a first detection circuit that outputs a first detection signal based on a photon incident on the first photoelectric converter,

27 a first output circuit that outputs a first pixel signal to outside of the first pixel in accordance with the first detection signal, and a first control circuit that controls whether the first detection signal is input into the first output circuit, wherein the second pixel includes a second photoelectric converter, a second detection circuit that outputs a second detection signal based on a photon incident on the second photoelectric converter, a second output circuit that outputs a second pixel signal to outside of the second pixel in accordance with the second detection signal, and a second control circuit that controls whether the second detection signal is input into the second output circuit, wherein the third pixel includes a third photoelectric converter, a third detection circuit that outputs a third detection signal based on a photon incident on the third photoelectric converter, a third output circuit that outputs a third pixel signal to outside of the third pixel in accordance with the third detection signal, and a third control circuit that controls whether the third detection signal is input into the third output circuit, wherein the first control circuit controls whether the first detection signal is input into the first output circuit in accordance with the second detection signal, and wherein the third control circuit determines whether the third detection signal is output to the third output circuit in accordance with the second detection signal.

2. The photoelectric conversion apparatus according to claim 1, wherein each of the first photoelectric converter and the second photoelectric converter is an avalanche photodiode.

3. The photoelectric conversion apparatus according to claim 1, wherein the first output circuit includes a memory that holds the first detection signal or a counter circuit that counts the first detection signal.

4. The photoelectric conversion apparatus according to claim 1, wherein the first control circuit is a logic circuit that calculates logical AND of the first detection signal and the second detection signal.

5. The photoelectric conversion apparatus according to claim 1, wherein the second control circuit determines whether the second detection signal is input into the second output circuit in accordance with the first detection signal.

6. The photoelectric conversion apparatus according to claim 1, wherein the first pixel and the second pixel are arranged in a first direction, and wherein the second pixel and the third pixel are arranged in a second direction intersecting with the first direction.

7. The photoelectric conversion apparatus according to claim 1, wherein the first control circuit determines whether the first detection signal is output to the first output circuit in accordance with the third detection signal.

8. The photoelectric conversion apparatus according to claim 1, further comprising:

a fourth pixel, wherein the fourth pixel includes a fourth photoelectric converter, a fourth detection circuit that outputs a fourth detection signal based on a photon incident on the fourth photoelectric converter, a fourth output circuit that outputs a fourth pixel signal to outside of the fourth pixel in accordance with the fourth detection signal, and a fourth control circuit that controls whether the fourth detection signal is input into the fourth output circuit, and wherein the first control circuit determines whether the first detection signal is output to the first output circuit in accordance with the second detection signal and the fourth detection signal.

9. The photoelectric conversion apparatus according to claim 8, wherein the first pixel and the second pixel are arranged in a first direction, and wherein the second pixel and the fourth pixel are arranged in a third direction intersecting with the first direction.

10. The photoelectric conversion apparatus according to claim 1, wherein the second pixel, among the plurality of pixels included in the pixel region, is not a pixel closest to the first pixel.

11. The photoelectric conversion apparatus according to claim 1, wherein the first detection circuit includes a first selection circuit that selects a detection period during which the first detection signal is detected and a non-detection period during which the first detection signal is not detected.

12. The photoelectric conversion apparatus according to claim 1, wherein the first pixel includes a first quench element, wherein the first detection circuit includes a first latch circuit, and wherein the first latch circuit and the first quench element are controlled with a common reset signal.

13. The photoelectric conversion apparatus according to claim 1, wherein the first detection circuit includes a monostable circuit that outputs the first detection signal having a pulse width shorter than a pulse width of an input signal into the first detection circuit.

14. The photoelectric conversion apparatus according to claim 1, wherein a number of pixels from which detection signals that are controlled by the first control circuit are output is the same as a number of pixels including output circuits that are controlled by the first control circuit.

15. The photoelectric conversion apparatus according to claim 1, wherein a number of detection signals that control control circuits of pixels that are, among the plurality of pixels, arranged on an outermost periphery of the pixel region is smaller than a number of detection signals that control control circuits of pixels that are, among the plurality of pixel, not arranged on the outermost periphery of the pixel region.

16. The photoelectric conversion apparatus according to claim 1, wherein, when the photon is detected at the first pixel before the photon is detected at the second pixel within a unit time, the first detection signal is input into the first output circuit.

17. The photoelectric conversion apparatus according to claim 1, wherein, when the photon is detected at the second pixel before the photon is detected at the first pixel within a unit time, the first detection signal is input into the first output circuit.

18. The photoelectric conversion apparatus according to claim 1, wherein the photoelectric conversion apparatus is capable of operating in a first drive mode in which the first detection signal is input into the first control circuit in accordance with the second detection signal and in a second drive mode in which the first detection signal is input into the first control circuit regardless of the second detection signal.

19. The photoelectric conversion apparatus according to claim 1, wherein the photoelectric conversion apparatus is a multilayer sensor having a sensor substrate and a circuit substrate laminated therein, wherein the first photoelectric converter is arranged on the sensor substrate, and wherein the first output circuit is arranged on the circuit substrate.

20. The photoelectric conversion apparatus according to claim 19, wherein the first control circuit is arranged on the circuit substrate.

21. A photoelectric conversion system including a plurality of photoelectric conversion apparatuses each being the photoelectric conversion apparatus according to claim 1, the photoelectric conversion system comprising:

a light emitter that emits light detected by the plurality of photoelectric conversion apparatuses; and a distance acquisition unit configured to calculate a distance using digital signals held in the plurality of photoelectric conversion apparatuses.

22. A movable body comprising:

the photoelectric conversion apparatus according to claim 1;

a distance acquisition unit configured to acquire distance information to a target object from a parallax image based on a signal from the photoelectric conversion apparatus; and a control unit configured to control the movable body based on the distance information.

23. A photoelectric conversion apparatus comprising:

a pixel region including a plurality of pixels arranged in an array pattern, wherein the plurality of pixels includes a first pixel, a second pixel, and a fourth pixel, wherein the first pixel includes a first photoelectric converter, a first detection circuit that outputs a first detection signal based on a photon incident on the first photoelectric converter, a first output circuit that outputs a first pixel signal to outside of the first pixel in accordance with the first detection signal, and a first control circuit that controls whether the first detection signal is input into the first output circuit, wherein the second pixel includes a second photoelectric converter, a second detection circuit that outputs a second detection signal based on a photon incident on the second photoelectric converter, a second output circuit that outputs a second pixel signal to outside of the second pixel in accordance with the second detection signal, and a second control circuit that controls whether the second detection signal is input into the second output circuit, wherein the fourth pixel includes a fourth photoelectric converter, a fourth detection circuit that outputs a fourth detection signal based on a photon incident on the fourth photoelectric converter, a fourth output circuit that outputs a fourth pixel signal to outside of the fourth pixel in accordance with the fourth detection signal, and a fourth control circuit that controls whether the fourth detection signal is input into the fourth output circuit, wherein the first control circuit controls whether the first detection signal is input into the first output circuit in accordance with the second detection signal, and wherein the first control circuit determines whether the first detection signal is output to the first output circuit in accordance with the second detection signal and the fourth detection signal.

24. A photoelectric conversion apparatus comprising:

a pixel region including a plurality of pixels arranged in an array pattern, wherein the plurality of pixels includes a first pixel and a second pixel, wherein the first pixel includes a first photoelectric converter, a first detection circuit that outputs a first detection signal based on a photon incident on the first photoelectric converter, a first output circuit that outputs a first pixel signal to outside of the first pixel in accordance with the first detection signal, and a first control circuit that controls whether the first detection signal is input into the first output circuit, wherein the second pixel includes a second photoelectric converter, a second detection circuit that outputs a second detection signal based on a photon incident on the second photoelectric converter, a second output circuit that outputs a second pixel signal to outside of the second pixel in accordance with the second detection signal, and a second control circuit that controls whether the second detection signal is input into the second output circuit, and wherein the photoelectric conversion apparatus is capable of operating in a first drive mode in which the first detection signal is input into the first control circuit in accordance with the second detection signal and in a second drive mode in which the first detection signal is input into the first control circuit regardless of the second detection signal are provided.

* * * * *